(12) United States Patent
Takemura

(10) Patent No.: US 6,879,210 B2
(45) Date of Patent: Apr. 12, 2005

(54) VARIABLE GAIN AMPLIFIER

(75) Inventor: Gaku Takemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/422,841

(22) Filed: Apr. 25, 2003

(65) Prior Publication Data
US 2003/0231059 A1 Dec. 18, 2003

(30) Foreign Application Priority Data
Apr. 25, 2002 (JP) .................................... 2002-124898

(51) Int. Cl.[7] ............................................. H03F 3/45
(52) U.S. Cl. .................................... 330/254; 330/261
(58) Field of Search ............................... 330/254, 261, 330/257; 327/359

(56) References Cited

U.S. PATENT DOCUMENTS 6,046,640 A * 4/2000 Brunner ..................... 330/254
6,215,989 B1 4/2001 Otaka
6,614,303 B2 * 9/2003 Nentwig ..................... 330/254

FOREIGN PATENT DOCUMENTS

JP 54-147761 * 11/1979
JP 2000-196386 7/2000

* cited by examiner

*Primary Examiner*—Henry Choe
(74) *Attorney, Agent, or Firm*—Oblon, Spivak, McClelland, Maier & Neustadt, P.C.

(57) ABSTRACT

A variable gain amplifier includes one transistor and the other transistor which configures a differential transistor pair. An output signal voltage is taken out from a collector terminal of the one transistor. A first gain control signal to control a gain is supplied to the other transistor. The amplifier also includes a first voltage/current converter connected to a common emitter terminal of the one transistor and the other transistor, the first voltage/current converter having an input signal voltage supplied thereto, a power circuit which applies a constant bias voltage to a base terminal of the one transistor, and a capacitor connected to at least a base terminal of the other transistor.

22 Claims, 9 Drawing Sheets

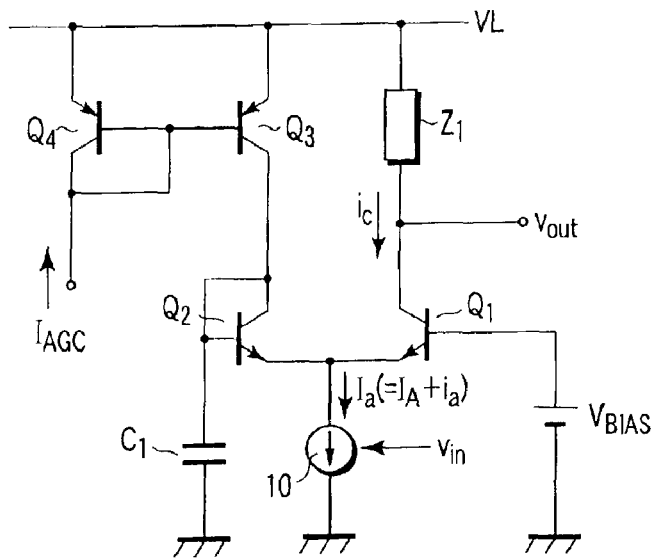
FIG. 4
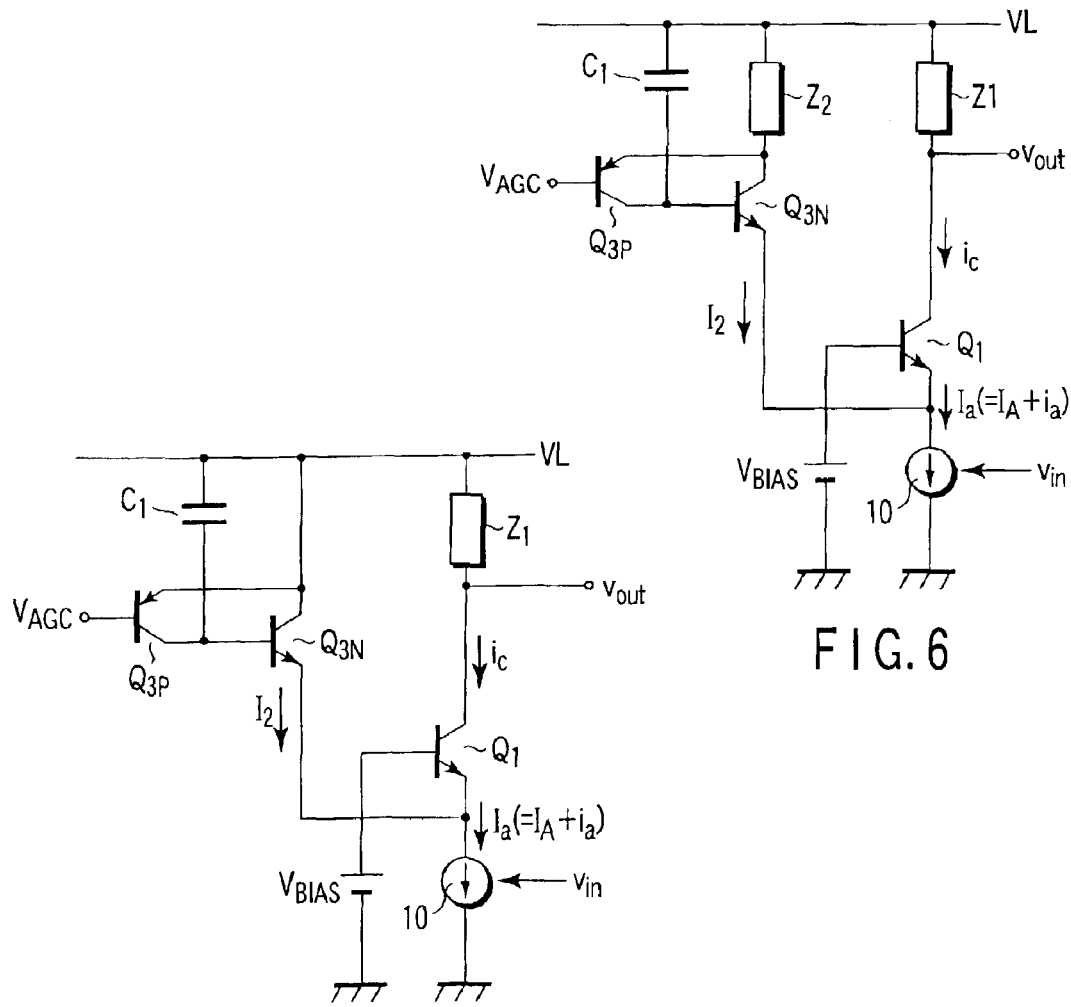
FIG. 6
FIG. 5

VARIABLE GAIN AMPLIFIER

CROSS-REFERENCE TO RELATED APPLICATIONS

This application is based upon and claims the benefit of priority from the prior Japanese Patent Application No. 2002-124898, filed Apr. 25, 2002, the entire contents of which are incorporated herein by reference.

BACKGROUND OF THE INVENTION

1. Field of the Invention

The present invention relates to a variable gain amplifier. More particularly, the present invention relates to a variable gain amplifier in which a gain changes in an exponential function manner according to a gain control voltage or a gain control current.

2. Description of the Related Art

In recent years, development of a CDMA (Code Division Multiple Access) system with a good use efficiency of a frequency is active underway. In the CDMA system, the range of control is wide with respect to a transmission power control and fine control is required. Thus, there is a need for a variable gain amplifier with high precision capable of achieving a wide range and fine transmission power control.

FIG. 14 shows an example of a conventional variable gain amplifier using a Gilbert multiplier. Here, a differential type variable gain amplifier is shown as an example. This amplifier has a feature that degradation of control precision due to distortion of element features is small.

That is, this variable gain amplifier has NPN transistors Qa, Qb which configure a differential transistor pair and NPN transistors Qc, Qd which configure a differential transistor pair. Base terminals of the transistor Qa and the transistor Qc each are connected in common so that a gain control voltage $V_Y$ is supplied between this common base terminal and each base terminal of the transistor Qb and the transistor Qd.

A collector terminal of an NPN transistor $Q_{101}$ is connected to a common emitter terminal of the transistors Qa, Qb. An emitter terminal of the transistor $Q_{101}$ is connected to a ground potential via a voltage/current converter 102. A collector terminal of an NPN transistor $Q_{103}$ is connected to a common emitter terminal of the transistors Qc, Qd. An emitter terminal of the transistor $Q_{103}$ is connected to a ground potential via a voltage/current converter 104. Then, an input signal voltage $v_{in}$ is supplied between base terminals of the transistor $Q_{101}$ and the transistor $Q_{103}$. The emitter terminal of the transistor $Q_{101}$ and the emitter terminal of the transistor $Q_{103}$ are connected in common via a resistor $R_E$.

On the other hand, a power voltage from a power line VL is supplied to a collector terminal of the transistor Qb. To a collector terminal of the transistor Qa, the power voltage from the power line VL is supplied via a resistor $R_1$. The power voltage from the power line VL is supplied to a collector terminal of the transistor Qd. To a collector terminal of the transistor Qc, the power voltage from the power line VL is supplied via a resistor $R_2$. Then, an output signal voltage $v_{out}$ according to a current $i_c$ is taken out from the collector terminals of the transistors Qa, Qc.

In the case of the amplifier shown in FIG. 14, a voltage gain $G_Y$ relevant to the gain control voltage $V_Y$ can be expressed as shown in the following formula (1). In the formula, A is a constant, and $V_T$ is a thermal voltage. exp represents an exponential function.

$$G_V = A/(1+\exp(V_Y/V_T)) \quad (1)$$

In the above formula (1), "1" of denominator can be ignored in a range such that $\exp(V_Y/V_T) \gg 1$. Therefore, the above voltage gain $G_V$ can be rewritten as shown in the following formula (2).

$$G_V = A \cdot \exp(-V_Y/V_T) \quad (2)$$

In general, in order to make gain control with high precision, it is desired that a relationship between the gain control voltage $V_Y$ and the voltage gain $G_V$ be log-linear. In a range of $\exp(V_Y/V_T) \gg 1$, in a conventional variable gain amplifier as well, a log-linear gain change can be achieved relevant to the gain control voltage $V_Y$. However, in a range of $\exp(V_Y/V_T) \gg 1$, the voltage gain $G_V$ is considerably small, and thus, it is disadvantageous in current consumption and noise. As in a CDMA system, there is a need for an amplifier with a wider, log-linear control range in use such that gain control with high precision is required over a wide range.

In order to achieve a log-linear gain control feature with high precision over a wide range, "1" of a denominator of the above formula (1) must be canceled. For that purpose, the following formula (3) may be established. However, K (>0) is a proportional constant, and $V_{AGC}$ ($\geq 0$) is a new gain control voltage of the variable gain amplifier. In addition, "ln" designates a natural logarithm function.

$$V_Y = V_T \cdot \ln\{\exp(K \cdot V_{AGC}/V_T) - 1\} \quad (3)$$

At this time, when the above formula (3) is substituted for the above formula (1), the following formula (4) is established. That is, the gain control voltage $V_{AGC}$ and the voltage gain $G_V$ are log-linear up to a maximum gain value.

$$G_V = A/\{\exp(K \cdot V_{AGC}/V_T)\} \quad (4)$$

In a variable gain amplifier shown in FIG. 15, a converter ($V_{AGC} \rightarrow V_T$) 105 of a gain control voltage is provided to achieve the above formula (3). That is, this converter 105 has NPN transistors Qe, Qf which configure a differential transistor pair. A base terminal and a connector terminal of the transistor Qe is connected to the common base terminal of the transistors Qa, Qc. A base terminal of the transistor Qf is connected to the base terminals of the transistor Qb and the transistor Qd each. Then, the gain control voltage $V_Y$ is supplied between the common base terminal of the transistor Qa and the transistor Qc and each of the base terminals of the transistor Qb and the transistor Qd. In addition, a reference bias voltage $V_{BIAS}$ is supplied between a base terminal of the transistor Qf and each of the base terminals of the transistors Qb, Qd. The power voltage from the power line VL is supplied to a collector terminal of the transistor Qf.

Moreover, a collector terminal of one PNP transistor Qh which configures a current mirror circuit is connected to the base terminal and collector terminal of the transistor Qe. To an emitter terminal of the transistor Qh, the power voltage of the power line VL is supplied via a resistor $R_4$. A base terminal of the transistor Qh is connected to a base terminal and a collector terminal of the other PNP transistor Qg which configures the current mirror circuit. To an emitter terminal of the transistor Qg, the power voltage from the power line VL is supplied via a resistor $R_3$. A collector terminal of an NPN transistor Qi is connected to the base terminal and collector terminal of the transistor Qg. An emitter terminal of the transistor Qi is connected to a ground potential. A base terminal of the transistor Qi is connected to a ground potential via a voltage/current converter 106, and connected to a base terminal of an NPN transistor Qj. In addition, a reference base voltage $V_B$ is supplied to a base terminal of the transistor Qj. A collector terminal of the transistor Qj is connected to a common emitter terminal of the transistors Qe, Qf. An emitter terminal of the transistor Qj is connected to a ground potential.

In the case of the variable gain amplifier, the gain control voltage $V_{AGC}$ is supplied to the base terminal of the transistor Qi via the voltage/current converter 106. In this manner, a gain control current $I_{AGC}$ proportional to the gain control voltage $V_{AGC}$ is provided to the resistor R. Namely, a voltage proportional to the gain control voltage $V_{AGC}$ is provided to the resistor R.

Here, assuming that $I_0$ is a constant current, a current $I_1$ ($\geqq 0$) which is $I_0 \cdot \exp(-K \cdot V_{AGC}/VT)$ flows the transistor Qe according to the gain control voltage $V_{AGC}$. This current $I_1$ generates a voltage $V_{BEQe}$ between a base and an emitter to the transistor Qe. On the other hand, a current $I_2$ (=$I_0-I_1$) flows the transistor Qf, and generates a voltage $V_{BEQf}$ between a base and an emitter.

A differential $V_Y$ (=$V_{BEQf}-V_{BEQe}$) between these voltages is as shown in the following formula (6) and meets a relationship of the above formula (3).

$$V_Y = V_T \cdot \ln[I_0\{1 - \exp(-K \cdot V_{AGC}/V_T)\}] - \quad (5)$$
$$V_T \cdot \ln\{I_0 \cdot \exp(-K \cdot V_{AGC}/V_T)\}$$

$$= V_T \cdot \ln\{\exp(K \cdot V_{AGC}/V_T) - 1\} \quad (6)$$

Therefore, in the case of the variable control amplifier shown in FIG. 15, a log-linear gain control feature with high precision over a wide range can be achieved (reference should be made to U.S. Pat. No. 6,215,989 B1, for example, for details).

FIG. 16 shows voltage gain features of the variable gain amplifier shown in FIG. 14 and the variable gain amplifier shown in FIG. 15 for comparison. In FIG. 16, gain control voltages $V_Y$, $V_{AGC}$ on a horizontal axis are standardized. As is evident from FIG. 16, it is found that the variable gain amplifier of FIG. 15 has more log-linear gain control feature over a very wide range (about 60 dB) than the variable gain amplifier of FIG. 14.

As described above, in the conventional variable gain amplifier, there can be achieved an exponential function shaped gain control feature in which a gain changes relevant to an input of a linear gain control voltage ($V_{AGC}$) in an exponential function manner, namely, an exponential gain control feature G=1/exp(K·$V_{AGC}$/$V_T$) can be achieved. However, there has been a problem that as the gain increases, a dynamic range decreases, and a distortion feature is likely to be impaired. That is, in a negative half-period of an output voltage waveform, a voltage $V_{CEQa}$ between a collector and an emitter of transistor Qa connected to a load (resistor $R_1$) is reduced. In particular, in the case where an amplitude of the output signal voltage $v_{out}$ is large, the voltage $V_{CEQa}$ between the collector and the emitter is smaller than a saturation voltage between the collector and the emitter (for example, 0.3V). In this manner, the transistor Qa enters a saturation state, and a distortion of an output voltage waveform rapidly increases.

In this manner, although a base voltage of the transistor Qb is maintained to be constant by the reference bias voltage $V_{BIAS}$, the base voltage of the transistor Qa fluctuates according to a gain, and is higher as the gain increases. Thus, as the gain increases, the dynamic range is reduced, and the distortion feature is likely to be impaired.

BRIEF SUMMARY OF THE INVENTION

According to a first aspect of the present invention, there is provided a variable gain amplifier comprising one transistor and the other transistor which configure a differential transistor pair, an output signal voltage being taken out from a collector terminal of the one transistor, and a first gain control signal to control a gain being supplied to the other transistor; a first voltage/current converter connected to a common emitter terminal of the one transistor and the other transistor, the converter having an input signal voltage supplied thereto; a power circuit which applies a constant bias voltage to a base terminal of the one transistor; and a capacitor connected to at least a base terminal of the other transistor.

According to a second aspect of the present invention, there is provided a variable gain amplifier comprising one transistor and the other transistor which configures a differential transistor pair, an output signal voltage being taken out from a collector terminal of the one transistor; a first voltage/current converter connected to a common emitter terminal of the one transistor and the other transistor, the first voltage/current converter having an input signal voltage supplied thereto; a power circuit which applies a constant bias voltage to a base terminal of the one transistor; a capacitor connected to at least a base terminal of the other transistor; and an input circuit connected to the other transistor, the input circuit being supplied with a second gain control signal to control a gain.

BRIEF DESCRIPTION OF THE SEVERAL VIEWS OF THE DRAWING

FIG. 4 is a circuit diagram depicting a base configuration of a variable gain amplifier in accordance with a fourth embodiment of the present invention;

FIG. 5 is a circuit diagram depicting a base configuration of a variable gain amplifier in accordance with a fifth embodiment of the present invention;

FIG. 6 is a circuit diagram depicting a base configuration of a variable gain amplifier in accordance with a sixth embodiment of the present invention;

DETAILED DESCRIPTION OF THE INVENTION

Embodiments of the present invention will be described in further detail with reference to the accompanying drawings.
(First Embodiment)

Figure 1:
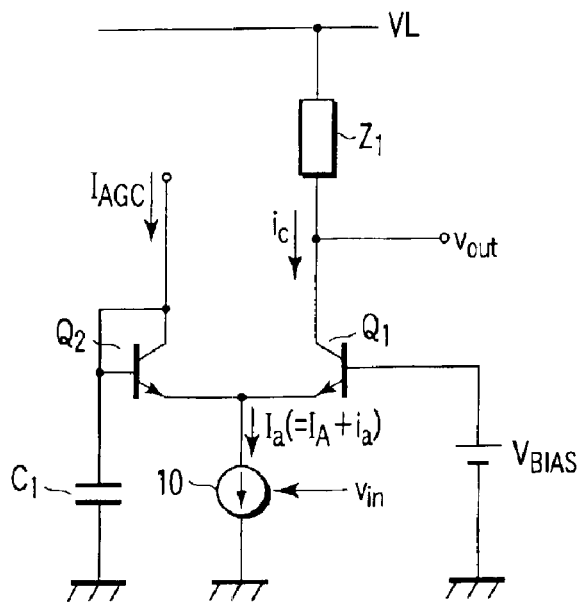
FIG. 1 is a circuit diagram depicting a base configuration of a variable gain amplifier in accordance with a first embodiment of the present invention.

FIG. 1 shows an example of a basic circuit configuration of a variable gain amplifier in accordance with a first embodiment of the present invention. Here, a description will be given by way of example of a single-phase variable gain amplifier of current control system in which a gain control is made by a gain control current.

That is, the variable gain amplifier is such that a gain is controlled by a gain control current $I_{AGC}$, and has one NPN transistor $Q_1$ and the other transistor $Q_2$ which configure a differential transistor pair. A voltage/current converter 10 is connected to a common emitter terminal of the transistors $Q_1$, $Q_2$ so that an input signal voltage $v_{in}$ is supplied via the voltage/current converter 10. Then, an output signal voltage $v_{out}$ according to a current $i_c$, which corresponds to a scale of the input signal voltage $v_{in}$, is taken out from a collector terminal of the transistor $Q_1$ that is an output transistor.

A reference bias voltage $V_{BIAS}$ is supplied to a base terminal of the transistor $Q_i$. Also, a power voltage from a power line VL is supplied to a collector terminal of the transistor $Q_1$ via a load element $Z_1$ such as a resistor or a coil. On the other hand, a base terminal and a collector terminal of the transistor $Q_2$ are connected in common, and further, are connected to a ground potential via a capacitor $C_1$. In addition, the gain control current $I_{AGC}$ is supplied to the base terminal and collector terminal of the transistor $Q_2$.

In such a configuration, the gain control current $I_{AGC}$ is supplied to the base terminal and collector terminal of the transistor $Q_2$. Then, the transistor $Q_2$ is turned ON, and a current ratio between a collector current (direct current component $I_c$) flowing the transistor $Q_1$ and the gain control current $I_{AGC}$ is determined. In this manner, a current $I_a$ (direct current component $I_A$ and alternating current component $i_a$) generated by the voltage/current converter 10 based on the input signal voltage $v_{in}$ is distributed by transistors $Q_1$, $Q_2$ based on the above current ratio.

In the case of the present embodiment, providing the capacitor $C_1$ allow to determine a distribution ratio of the alternating current component $i_a$ according to a distribution ratio of the direct current component $I_A$. For example, assuming that the above capacitor $C_1$ has a sufficiently large capacitance, the direct current component $I_A$ and the alternating current component $i_a$ of the above current $I_a$ caused by the transistors $Q_1$, $Q_2$ are substantially equal to each other. Namely, the gain control feature of this amplifier is determined according to the distribution ratio of the direct current component $I_A$ (direct current component $I_B$ of a collector current flowing the transistor $Q_2$: direct current component $I_C$ of a collector current flowing the transistor $Q_1$).

Here, a ratio of the direct current component $I_A$ of the current $I_a$, the direct current component $I_B$ of the collector current flowing the transistor $Q_2$, and the direct current component $I_C$ of the collector current flowing the transistor $Q_1$ is shown in the following formula (7).

$$I_A:I_B:I_C=I_A:I_{AGC}:(I_A-I_{AGC}) \quad (7)$$

Therefore, a current $i_c$ which is an alternating current component of the collector current flowing the transistor $Q_1$ is as shown in the following formula (8).

$$i_c=i_a\times((I_A-I_{AGC})/I_A) \quad (8)$$

In this manner, the alternating current component $i_a$ of the current $I_a$ is proportionally distributed according to the ratio $I_B:I_C$ of the direct current component, whereby the current $i_c$ is obtained.

The gain control current $I_{AGC}$ is thus directly imparted as the collector current of the transistor $Q_2$, whereby the output signal voltage $v_{out}$ according to the current $i_c$, which corresponds to the scale of the input signal voltage $v_{in}$, is taken out from the collector terminal of the transistor $Q_1$.

At this time, the base voltage of the transistor $Q_1$ is maintained to be constant by the reference bias voltage $V_{BIAS}$. Therefore, even if a gain is large, it becomes possible to prevent the dynamic range of the amplifier from being reduced.

Here, the output signal voltage $v_{out}$ is represented by the following formula (9).

$$v_{out}=i_a\times((I_A-I_{AGC})/I_A)\times Z_1 \quad (9)$$

In particular, in a mass output amplifier, the base voltage of the output transistor $Q_1$ is maintained to be constant by the reference bias voltage $V_{BIAS}$, thereby making it possible to maintain an output dynamic range to be substantially constant irrespective of the scale of gain. Therefore, the distortion feature of the amplifier can be improved from being impaired.

Figure 14:
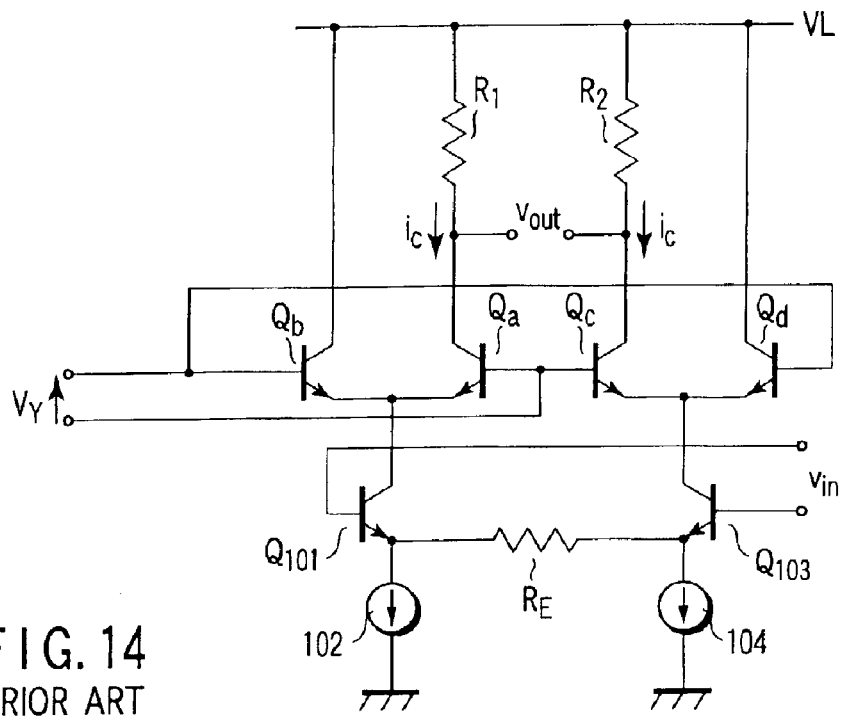
FIG. 14 is a circuit diagram of a variable gain amplifier using a Gilbert multiplier which is shown for illustrating a prior art and its problem.
Figure 16:
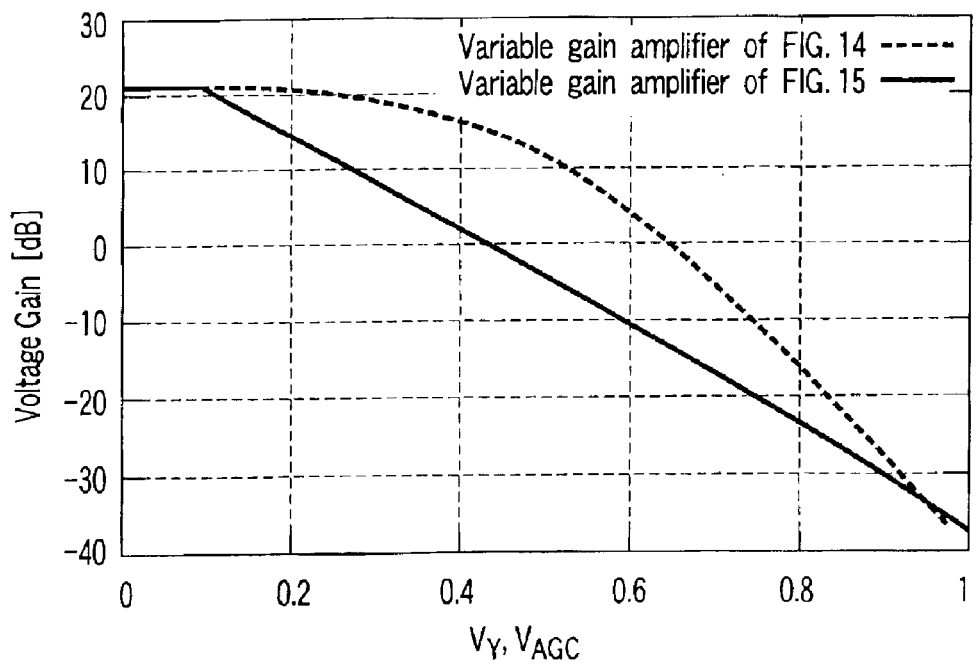
FIG. 16 is a view showing voltage gain features of the conventional variable gain amplifier shown in FIGS. 14 and 15 for comparison.
Figure 15:
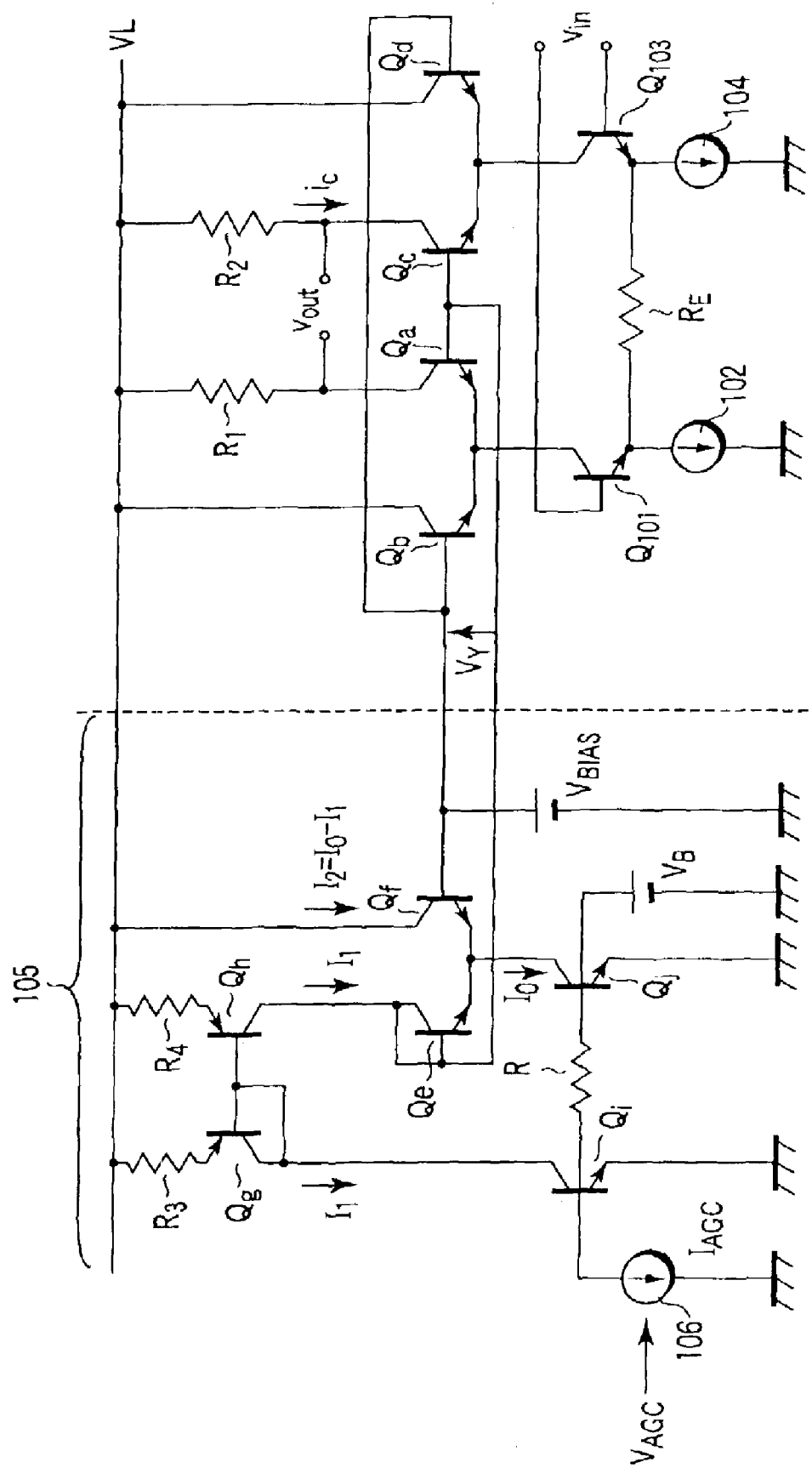
FIG. 15 is a circuit diagram showing an example of configuration of a converter for a gain control voltage in a conventional variable gain amplifier.

Also, the gain control current $I_{AGC}$ is determined completely irrelevant to the reference bias voltage $V_{BIAS}$. Thus, as compared with the conventional variable control amplifier shown in FIG. 14, there can be provided a variable gain amplifier for high frequency with high degree of freedom in the gain control voltage $V_Y$.
(Second Embodiment)

Figure 2:
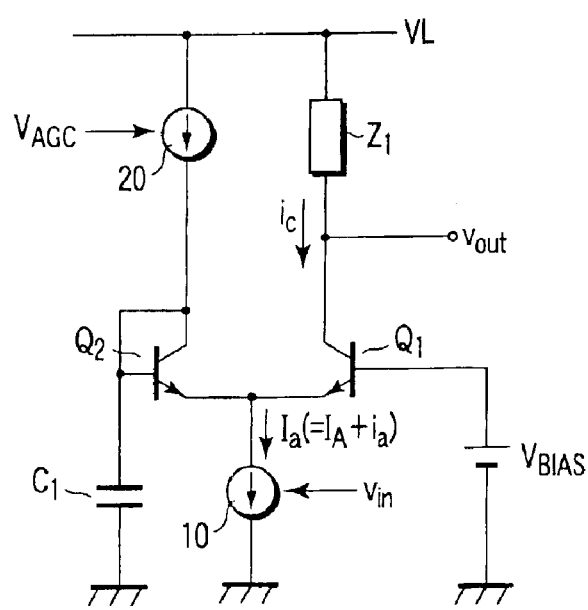
FIG. 2 is a circuit diagram depicting a base configuration of a variable gain amplifier in accordance with a second embodiment of the present invention.

FIG. 2 shows an example of a basic circuit configuration of a variable gain amplifier in accordance with a second embodiment of the present invention. Here, a description will be given by way of example of a single-phase variable gain amplifier of voltage control system which carries out gain control according to a gain control voltage.

That is, the variable gain amplifier is provided as an example in which a voltage control system is employed by providing a voltage/current converter 20 at a supply section of the gain control current $I_{AGC}$ in the variable gain amplifier shown in FIG. 1 described above. Like elements in FIG. 1 are designated by like reference numerals. A detailed description is omitted here.

In the case of the variable gain amplifier according to the present embodiment, the voltage/current converter 20 is connected to the base terminal and collector terminal of the NPN transistor $Q_2$ described above. To the voltage/current converter 20, the power voltage is supplied from the power line VL. Also, the above gain control voltage $V_{AGC}$ is supplied via the voltage/current converter 20.

This variable gain amplifier operates in such a manner that is substantially the same as the case of the variable gain amplifier shown in FIG. 1 described above. Namely, when a positive (or negative) gain control voltage $V_{AGC}$ with a power voltage being a reference is supplied to the voltage/current converter 20, the gain control current $I_{AGC}$ according to the gain control voltage $V_{AGC}$ is generated by the voltage/current converter 20. Then, the transistor $Q_2$ is turned ON, a current ratio between the collector current (direct current component $I_C$) flowing the output transistor $Q_1$ and the gain control current $I_{AGC}$ is determined. In this manner, the current $I_a$ (direct current component $I_A$ and alternating current component $i_a$) generated by the voltage/current converter 10 based on the input signal voltage $v_{in}$ is distributed by the transistors $Q_1$, $Q_2$ based on the above current ratio.

As a result, as is the case with the above described first embodiment, the output signal voltage $v_{out}$ according to the current $i_c$, which corresponds to the scale of the input signal voltage $v_{in}$, is taken out from the collector terminal of the output transistor $Q_1$. At this time, the base voltage of the output transistor $Q_1$ is maintained to be constant according to the reference bias voltage $V_{BIAS}$. Therefore, even if the gain is large, it becomes possible to prevent the dynamic range from being reduced.

In this manner, advantageous effect substantially identical to that of the variable gain amplifier shown in the above described first embodiment can be attained by the variable gain amplifier according to the second embodiment.

In particular, in a mass output amplifier, the base voltage of the output transistor $Q_1$ is maintained to be constant according to the reference bias voltage $V_{BIAS}$, thereby making it possible to maintain an output dynamic range to be substantially constant irrespective of the scale of gain. Thus, the distortion feature of the amplifier can be improved from being impaired.

In addition, the gain control voltage $V_{AGC}$ is determined completely irrelevant to the reference bias voltage $V_{BIAS}$. Thus, there can be provided a variable gain amplifier for high frequency with high degree of freedom for the gain control voltage $V_Y$ as compared with the conventional variable gain amplifier shown in FIG. 14.

(Third Embodiment)

Figure 3:
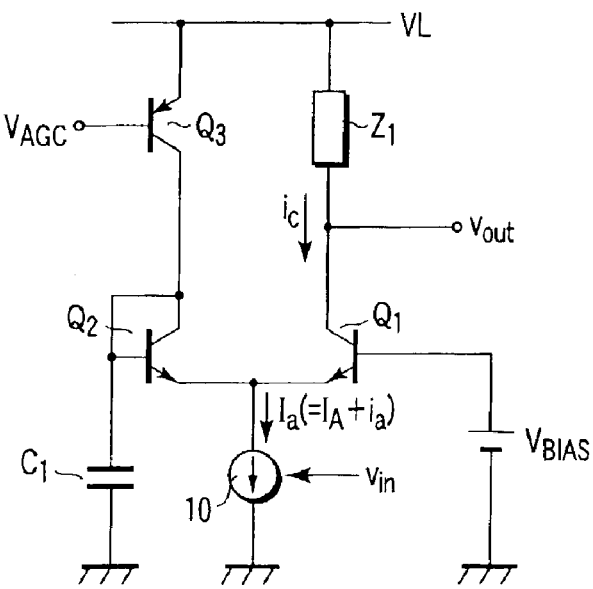
FIG. 3 is a circuit diagram depicting a base configuration of a variable gain amplifier in accordance with a third embodiment of the present invention.

FIG. 3 shows an example of a basic circuit configuration of a variable gain amplifier in accordance with a third embodiment of the present invention. Here, a description will be given by way of example of a simple phase variable gain amplifier of voltage control system which carries out gain control according to a gain control voltage.

That is, this variable gain amplifier is provided as an example in which a voltage control system is employed by providing a PNP transistor $Q_3$ at a supply section of the gain control current $I_{AGC}$ in the variable gain amplifier shown in FIG. 1 described above. Like elements in FIG. 1 are designated by like reference numerals. A detailed description is omitted here.

In the case of the variable gain amplifier according to the present embodiment, a collector terminal of the PNP transistor $Q_3$ for voltage/current conversion is connected to the base terminal and collector terminal of the NPN transistor $Q_2$ described above. The power voltage from the power line VL is supplied to an emitter terminal of the PNP transistor $Q_3$. In addition, the gain control voltage $V_{AGC}$ is supplied to a base terminal of the transistor $Q_3$.

This variable gain amplifier operates in such a manner that is substantially the same as the case of the variable gain amplifier shown in FIG. 1 described above. Namely, a positive (or negative) gain control voltage $V_{AGC}$ with a power voltage being a reference is applied to the base terminal of the transistor $Q_3$, the gain control current $I_{AGC}$ according to the gain control voltage $V_{AGC}$ is generated by this transistor $Q_3$. Then, the transistor $Q_2$ is turned ON, and a current ratio between the collector current (direct current component $I_C$) flowing the output transistor $Q_1$ and the gain control current $I_{AGC}$ is determined. In this manner, the current $I_a$ (direct current component $I_A$ and alternating current component $i_a$) generated by the voltage/current converter 10 based on the input signal voltage $v_{in}$ is distributed by the transistors $Q_1$, $Q_2$ based on the above current ratio.

As a result, as is the case with the above described first embodiment, the output signal voltage $v_{out}$ according to the current $i_c$, which corresponds to the scale of the input signal voltage $v_{in}$, is taken out from the collector terminal of the output transistor $Q_1$. At this time, the base voltage of the output transistor $Q_1$ is maintained to be constant according to the reference bias voltage $V_{BIAS}$. Therefore, even if the gain is large, it becomes possible to prevent the dynamic range from being reduced.

In this manner, advantageous effect substantially identical to that of the variable gain amplifier shown in the above described first embodiment can be attained by the variable gain amplifier according to the third embodiment.

In particular, in a mass output amplifier, the base voltage of the output transistor $Q_1$ is maintained to be constant according to the reference bias voltage $V_{BIAS}$, thereby making it possible to maintain an output dynamic range to be substantially constant irrespective of the scale of gain. Thus, the distortion feature of the amplifier can be improved from being impaired.

In addition, the gain control voltage $V_{AGC}$ is determined completely irrelevant to the reference bias voltage $V_{BIAS}$. Thus, there can be provided a variable gain amplifier for high frequency with high degree of freedom for the gain control voltage $V_Y$ as compared with the conventional variable gain amplifier shown in FIG. 14.

(Fourth Embodiment)

FIG. 4 is an example of a basic circuit configuration of a variable gain amplifier in accordance with a fourth embodiment of the present invention. Here, a description will be given by way of example of a single-phase variable gain amplifier of current control system which carries out gain control according to a gain control current.

That is, this variable gain amplifier is provided as an example in which a current control system is employed by providing a current mirror circuit (PNP transistors $Q_3$, $Q_4$) to a supply section of the gain control current $I_{AGC}$ in the variable gain amplifier shown in FIG. 1 described above. Like elements in FIG. 1 are designated by like reference numerals. A detailed description is omitted here.

In the case of the variable gain amplifier according to the present embodiment, a collector terminal of one PNP transistor $Q_3$ configuring a current mirror circuit for current/voltage conversion is connected to the base terminal and collector terminal of the above-described NPN transistor $Q_2$. The power voltage from the power line VL is supplied to an emitter terminal of the transistor $Q_3$. In addition, a base terminal of the transistor $Q_3$ is connected to the base terminal and collector terminal of the other PNP transistor $Q_4$ configuring the above-described current mirror circuit. The power voltage from the power line VL is supplied to an emitter terminal of the transistor $Q_4$. Then, the above gain control current $I_{AGC}$ is supplied to the base terminal and collector terminal of the transistor $Q_4$.

This variable gain amplifier operates in such a manner that is substantially the same as the case of the variable gain amplifier shown in FIG. 1 described above. Namely, when the gain control current $I_{AGC}$ is supplied to the base terminal and collector terminal of the transistor $Q_4$, the base voltage of the transistor $Q_3$ is generated by the transistor $Q_4$. The collector current of the transistor $Q_2$ according to the gain control current $I_{AGC}$ is generated by the transistor $Q_3$. Then, the transistor $Q_2$ is turned ON, and a current ratio between the collector current (direct current component $I_C$) flowing the output transistor $Q_1$ and the collector current flowing the transistor $Q_2$ is determined. In this manner, the current $I_a$ (direct current component $I_A$ and alternating current component $i_a$) generated by the voltage/current converter 10 based on the input signal voltage $v_{in}$ is distributed by the transistors $Q_1$, $Q_2$ based on the above current ratio.

As a result, as is the case with the above described first embodiment, the output signal voltage $v_{out}$ according to the current $i_c$, which corresponds to the scale of the input signal voltage $v_{in}$, is taken out from the collector terminal of the output transistor $Q_1$. At this time, the base voltage of the output transistor $Q_1$ is maintained to be constant according to the reference bias voltage $V_{BIAS}$. Therefore, even if the gain is large, it becomes possible to prevent the dynamic range from being reduced.

In this manner, advantageous effect substantially identical to that of the variable gain amplifier shown in the above described first embodiment can be attained by the variable gain amplifier according to the third embodiment.

In particular, in a mass output amplifier, the base voltage of the output transistor $Q_1$ is maintained to be constant according to the reference bias voltage $V_{BIAS}$, thereby making it possible to maintain an output dynamic range to be substantially constant irrespective of the scale of gain. Thus, the distortion feature of the amplifier can be improved from being impaired.

In addition, the gain control current $I_{AGC}$ is determined completely irrelevant to the reference bias voltage $V_{BIAS}$. Thus, there can be provided a variable gain amplifier for high frequency with high degree of freedom for the gain control voltage $V_Y$ as compared with the conventional variable gain amplifier shown in FIG. 14.

(Fifth Embodiment)

FIG. 5 shows an example of a basic circuit configuration of a variable gain amplifier in accordance with a fifth embodiment of the present invention. Here, a description will be given by way of example of a single-phase variable gain amplifier of voltage control system which carries out gain control according to a gain control voltage.

That is, this variable gain amplifier is such that a gain is controlled according to a gain control voltage $V_{AGC}$, and has an inverted darlington circuit including a PNP transistor $Q_{3P}$ for voltage/current conversion and an NPN transistor $Q_{3N}$ for current amplification. Also, this variable gain amplifier has the above transistor $Q_{3N}$ and NPN transistor (output transistor) $Q_{11}$, and a differential transistor pair is configured. A voltage/current converter 10 is connected to a common emitter terminal of both of the transistors $Q_{3N}$, $Q_1$. An input signal voltage $v_{in}$ is supplied via this voltage/current converter 10. Then, an output signal voltage $v_{out}$ according to a current $i_c$ corresponding to the scale of the input signal voltage $v_{in}$ is taken out from a collector terminal of the output transistor $Q_1$.

The reference bias voltage $V_{BIAS}$ is supplied to a base terminal of the transistor $Q_1$. In addition, to the collector terminal of the transistor $Q_1$, the power voltage from the power line VL is supplied via a load element $Z_1$ such as a resistor or a coil. On the other hand, a collector terminal of the transistor $Q_{3N}$ is connected to an emitter terminal of the transistor $Q_{3P}$. Then, the power voltage from the power line VL is supplied to the collector terminal of the transistor $Q_{3N}$ and the emitter terminal of the transistor $Q_{3P}$. Also, a base terminal of the transistor $Q_{3N}$ is connected to a collector terminal of the transistor $Q_{3P}$. Then, the power voltage from the power line VL is supplied via a capacitor $C_1$ to the base terminal of the transistor $Q_{3N}$ and the collector terminal of the transistor $Q_{3P}$. In addition, the gain control voltage $V_{AGC}$ is supplied to the base terminal of the transistor $Q_{3P}$.

This variable gain amplifier operates in such a manner that is substantially the same as the case of the variable gain amplifier shown in FIG. 3 described above. Namely, a gain control voltage $V_{AGC}$ with a positive (or negative) power voltage being a reference is supplied to the base terminal of the transistor $Q_{3P}$. Then, an emitter current ($I_2$) of the transistor $Q_{3N}$ is generated according to the base voltage of the transistor $Q_{3N}$. In this manner, a voltage $V_{BE3N}$ between the base and the emitter of the transistor $Q_{3N}$ is determined.

In the case of the present embodiment, when an emitter grounding current amplification rate of the transistor $Q_{3N}$ is defined as $\beta_{3N}$, a base current of the transistor $Q_{3N}$ is obtained as $I_2/\beta_{3N}$, and a collector current of the transistor $Q_{3P}$ is obtained as $I_2/\beta_{3N}$. Here, a relationship as shown in the following formula (11) is established between a transistor collector current $I_c$ and a voltage $V_{BE}$ between the base and the emitter, where $I_s$ is a transistor saturation current.

$$I_c = I_s \cdot \exp(V_{BE}/V_T)\} \tag{11}$$

When a total of current flowing both of the transistors $Q_1$, $Q_2$ in the variable gain amplifier in FIG. 3 described above is the same as that flowing both of the transistors $Q_1$, $Q_{3N}$ in the variable gain amplifier shown in FIG. 5, the collector current of the transistor $Q_3$ and the collector current of the transistor $Q_{3N}$ are substantially the same. The collector current of the transistor $Q_{3P}$ is obtained as $1/\beta_{3N}$ of the collector current of the transistor $Q_3$. $\beta_{3N}$ is generally a value of some tens to some hundreds, and thus, the collector current of the transistor $Q_{3P}$ is very small.

In some IC manufacturing processes, a PNP transistor is greater than an NPN transistor with respect to a chip area required to supply the same collector current. Adopting such processes, in use of a mass current and mass output, the amplifier shown in FIG. 5 is more preferred than that shown in FIG. 3. Namely, in the case of the amplifier shown in FIG. 5, almost of the current flows the NPN transistor $Q_{3N}$. Because of this, in the case where a variable gain amplifier of mass current and mass output is provided, a chip area can be reduced by using the NPN transistor $Q_{3N}$ whose area is small.

When a voltage $V_{BE3N}$ between the base and the emitter of transistor $Q_{3N}$ is determined as described above, a current ratio between the collector current (direct current component $I_C$) flowing the output transistor $Q_1$ and the emitter current $I_2$ is determined according to the emitter current $I_2$. In this manner, the current $I_a$ (direct current component $I_A$ and alternating current component $i_a$) generated by the voltage/current converter 10 based on the input signal voltage $v_{in}$ is distributed by transistors $Q_1$, $Q_{3N}$ based on the above current ratio.

In the case of the present embodiment, providing the capacitor $C_1$ allow to determine a distribution ratio of the alternating current component $i_a$ according to a distribution ratio of the direct current component $I_A$. For example, assuming that the above capacitor $C_1$ has a sufficiently large capacitance, the direct current component $I_A$ and the alternating current component $i_a$ of the above current $I_a$ caused by the transistors $Q_1$, $Q_{3N}$ are substantially equal to each other. Namely, the gain control feature of this amplifier is determined according to the distribution ratio of the direct current component $I_A$ (direct current component $I_B$ of a collector current flowing the transistor $Q_{3N}$: direct current component $I_C$ of a collector current flowing the transistor $Q_1$).

As a result, as is the case with the above described third embodiment, the output signal voltage $v_{out}$ according to the current $i_c$, which corresponds to the scale of the input signal voltage $v_{in}$, is taken out from the collector terminal of the output transistor $Q_1$. At this time, the base voltage of the output transistor $Q_1$ is maintained to be constant according to the reference bias voltage $V_{BIAS}$. Therefore, even if a gain is large, it becomes possible to prevent a dynamic range from being reduced.

In this manner, an advantageous effect substantially similar to that of the variable gain amplifier shown in the third embodiment described above can be attained by the variable gain amplifier according to the fifth embodiment.

In particular, in a mass output amplifier, the base voltage of the output transistor $Q_1$ is maintained to be constant by the reference bias voltage $V_{BIAS}$, thereby making it possible to maintain an output dynamic range to be substantially constant irrespective of the scale of gain. Thus, the distortion feature of the amplifier can be improved from being impaired.

In addition, the gain control voltage $V_{AGC}$ is determined completely irrespective of the reference bias voltage $V_{BIAS}$. Thus, there can be provided a variable gain amplifier for high frequency with high degree of freedom for the gain control voltage $V_T$ as compared with the conventional variable gain amplifier shown in FIG. 14.

Moreover, the NPN transistor $Q_{3B}$ whose area is small can be used, thus making it possible to reduce a chip area even in the case where the transistor is employed for use of mass current and mass output.

(Sixth Embodiment)

FIG. 6 shows an example of a basic circuit configuration of a variable gain amplifier in accordance with a sixth embodiment of the present invention. Here, a description will be given by way of example of a single-phase variable gain amplifier of voltage control system which carries out gain control according to a gain control voltage.

That is, this variable gain amplifier is provided as an example in which an element for distortion proof of the inverted darlington circuit is further added in the variable gain amplifier shown in FIG. 5 described above. Like elements in FIG. 5 are designated by like reference numerals. A detailed description is omitted here.

In the variable gain amplifier according to the present embodiment, the power voltage from the power line VL is supplied to the collector terminal of the transistor $Q_{3N}$ and the emitter terminal of the transistor $Q_{3P}$ via a load element $Z_2$ comprising a resistor, a coil or the like. In the case of this variable gain amplifier, the above load element $Z_2$ functions as an element for distortion proof of the inverted darlington circuit. Thus, more stable operation can be made as compared with the variable gain amplifier shown in FIG. 5.

(Seventh Embodiment)

Figure 7:
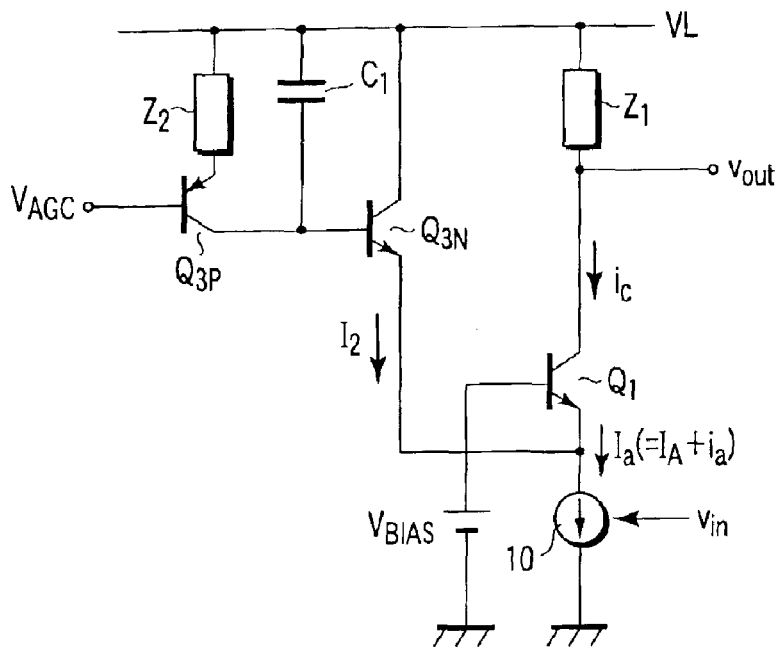
FIG. 7 is a circuit diagram depicting a base configuration of a variable gain amplifier in accordance with a seventh embodiment of the present invention.

FIG. 7 shows an example of a basic circuit configuration of a variable gain amplifier in accordance with a seventh embodiment of the present invention. Here, a description will be given by way of example of a single-phase variable gain amplifier of voltage control system which carries out gain control according to a gain control voltage.

That is, this variable gain amplifier is provided as a still another example in which an element for distortion proof of the inverted darlington circuit is added in the variable gain amplifier shown in FIG. 5 described above. Like elements in FIG. 5 are designated by like reference numerals. A detailed description is omitted here.

In the variable gain amplifier according to the present embodiment, the power voltage from the power line VL is supplied to the collector terminal of the transistor $Q_{3N}$. In addition, the power voltage from the power line VL is supplied to the emitter terminal of the transistor $Q_{3P}$ via a load element $Z_2$. In the case of this variable gain amplifier as well, as is the case with the variable gain amplifier shown in FIG. 6, the load element $Z_2$ functions as an element for distortion proof of the inverted darlington circuit. Thus, more stable operation can be made as compared with the variable gain amplifier shown in FIG. 5.

(Eighth Embodiment)

Figure 8:
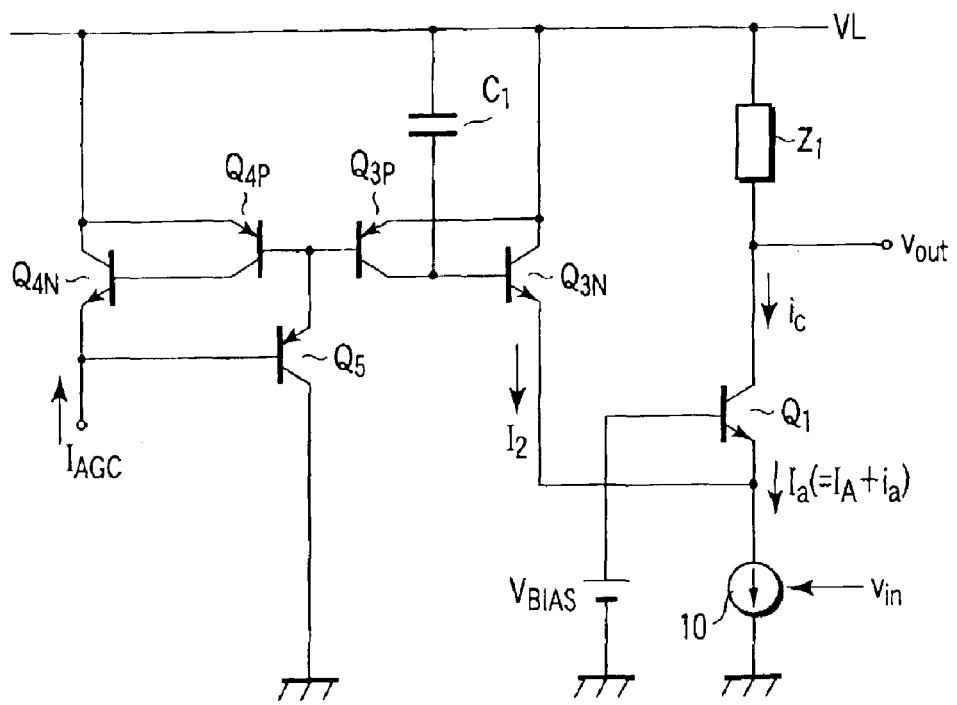
FIG. 8 is a circuit diagram depicting a base configuration of a variable gain amplifier in accordance with an eighth embodiment of the present invention.

FIG. 8 shows an example of a basic circuit configuration of a variable gain amplifier in accordance with an eighth embodiment of the present invention. Here, a description will be given by way of example of a single-phase variable gain amplifier of current control system which carries out gain control according to a gain control current.

That is, this variable gain amplifier is provided as an example in which, in the variable gain amplifier shown in FIG. 5 described above, a current mirror circuit using an inverted darlington circuit is provided at a supply section of the gain control current $I_{AGC}$, thereby employing a current control system. Like elements in FIG. 5 are designated by like reference numerals. A detailed description is omitted here.

In the case of the variable gain amplifier according to the present embodiment, the above current mirror circuit is configured to include: a PNP transistor $Q_{3P}$ and an NPN transistor $Q_{3N}$ connected via an inverted darlington circuit; and a PNP transistor $Q_{4P}$ and an NPN transistor $Q_{4N}$ connected via an inverted darlington circuit. In addition, a differential transistor pair is configured to have the transistor $Q_{3N}$ and the NPN transistor (output transistor) $Q_1$.

A base terminal of the transistor $Q_{3P}$ is connected to a base terminal of the transistor $Q_{4P}$ and an emitter terminal of a PNP transistor $Q_5$ serving as an element for constant voltage generation. An emitter terminal of the transistor $Q_{4P}$ is connected to a collector terminal of the transistor $Q_{4N}$. Then, the power voltage from the power line VL is supplied to the collector terminal of the transistor $Q_{4N}$ and the emitter terminal of the transistor $Q_{4P}$. In addition, a collector terminal of the transistor $Q_{4P}$ is connected to a base terminal of the transistor $Q_{4N}$. An emitter terminal of the transistor $Q_{4N}$ is connected to the base terminal of the transistor $Q_5$. A collector terminal of the transistor $Q_5$ is connected to a ground potential. Then, the gain control current $I_{AGC}$ is supplied to the base terminal of the transistor $Q_5$ and the emitter terminal of the transistor $Q_{4N}$.

This variable gain amplifier operates in such a manner that is substantially the same as the case of the variable gain amplifier shown in FIG. 5 described above. Namely, the gain control current $I_{AGC}$ is supplied to the emitter terminal of the transistor $Q_{4N}$ and the base terminal of the transistor $Q_5$. Then, an emitter current ($I_2$) of the transistor $Q_{3N}$ is generated according to a base voltage of the transistor $Q_{4P}$. In this manner, a voltage $V_{BE3N}$ between the base and the emitter of the transistor $Q_{3N}$ is determined.

When the voltage $V_{BE3N}$ between the base and the emitter of the transistor $Q_{3N}$ is determined, a current ratio between the collector current (direct current component $I_C$) flowing the output transistor $Q_1$ and the emitter current $I_2$ is determined according to the emitter current $I_2$. In this manner, the current $I_a$ (direct current component $I_A$ and alternating current component $i_a$) generated by the voltage/current converter 10 based on the input signal voltage $v_{in}$ is distributed by the transistors $Q_1$, $Q_{3N}$ based on the above current ratio.

As a result, as is the case with the fifth embodiment described above, an output signal voltage $v_{out}$ according to the current $i_c$, which corresponds to the scale of the input signal voltage $v_{in}$, is taken out from the collector terminal of the output transistor $Q_1$. At this time, the base voltage of the output transistor $Q_1$ is maintained to be constant according to a reference bias voltage $V_{BIAS}$. Therefore, even if a gain is large, it becomes possible to prevent a dynamic range from being reduced.

In this manner, an advantageous effect substantially similar to that of the variable gain amplifier shown in the fifth embodiment described above can be attained by the variable gain amplifier according to the eighth embodiment.

In particular, in a mass output amplifier, the base voltage of the output transistor $Q_1$ is maintained to be constant according to the reference bias voltage $V_{BIAS}$, thereby making it possible to maintain an output dynamic range to be substantially constant irrespective of the scale of gain. Thus, an amplifier distortion feature can be improved from being impaired.

In addition, the gain control current $I_{AGC}$ is determined completely irrespective of the reference bias voltage $V_{BIAS}$. Thus, there can be provided a variable gain amplifier for high frequency with high degree of freedom for the gain control voltage $V_Y$ as compared with the conventional variable gain amplifier shown in FIG. 14.

Moreover, PNP transistors $Q_{3P}$, $Q_{4P}$ whose area is small can be used, thus making it possible to reduce a chip area even in the case where the transistors are employed for use of mass current and mass output.

(Ninth Embodiment)

Figure 9:
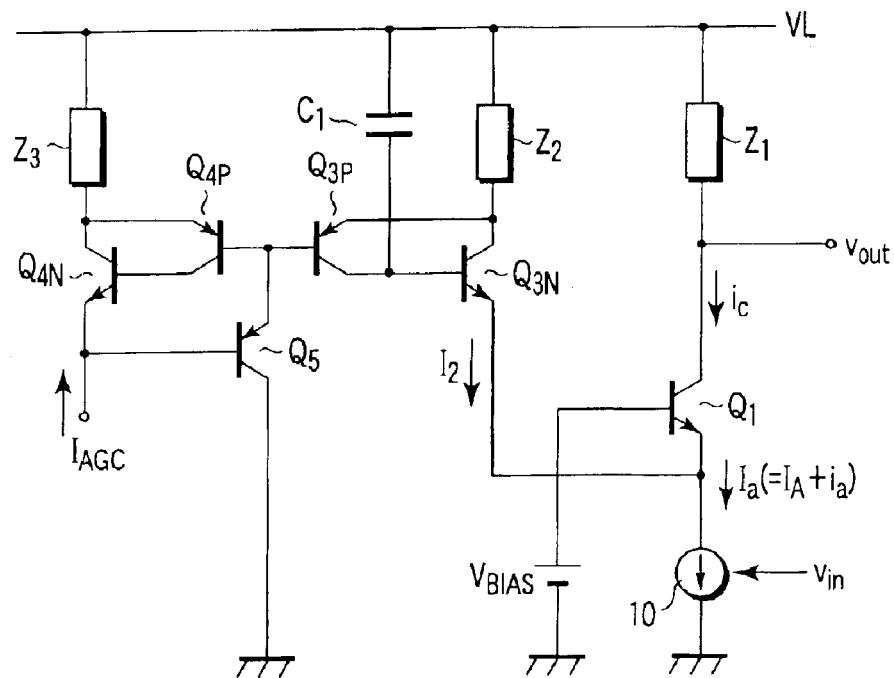
FIG. 9 is a circuit diagram depicting a base configuration of a variable gain amplifier in accordance with a ninth embodiment of the present invention.

FIG. 9 shows an example of a basic circuit configuration of a variable gain amplifier in accordance with a ninth embodiment of the present invention. Here, a description will be given by way of example of a single-phase variable gain amplifier of current control system which carried out gain control according to a gain control current.

That is, this variable gain amplifier is provided as an example in which an element for distortion proof of the inverted darlington circuit is further added in the variable gain amplifier shown-in FIG. 8 described above. Like elements in FIG. 8 are designated by like reference numerals. A detailed description is omitted here.

In the variable gain amplifier according to the present embodiment, the power voltage from the power line VL is supplied to the collector terminal of the transistor $Q_{3N}$ and the emitter terminal of the transistor $Q_{3P}$ via a load element $Z_2$ comprising a resistor, a coil or the like. In addition, the power voltage from the power line VL is supplied to the collector terminal of the transistor $Q_{4N}$ and the emitter terminal of the transistor $Q_{4P}$, via a load element $Z_3$ comprising a resistor, a coil or the like. In the case of this variable gain amplifier, the above load elements $Z_2$, $Z_3$ function as elements for distortion proof of the inverted darlington circuit. Thus, more stable operation can be made as compared with the variable gain amplifier shown in FIG. 8.

(Tenth Embodiment)

Figure 10:
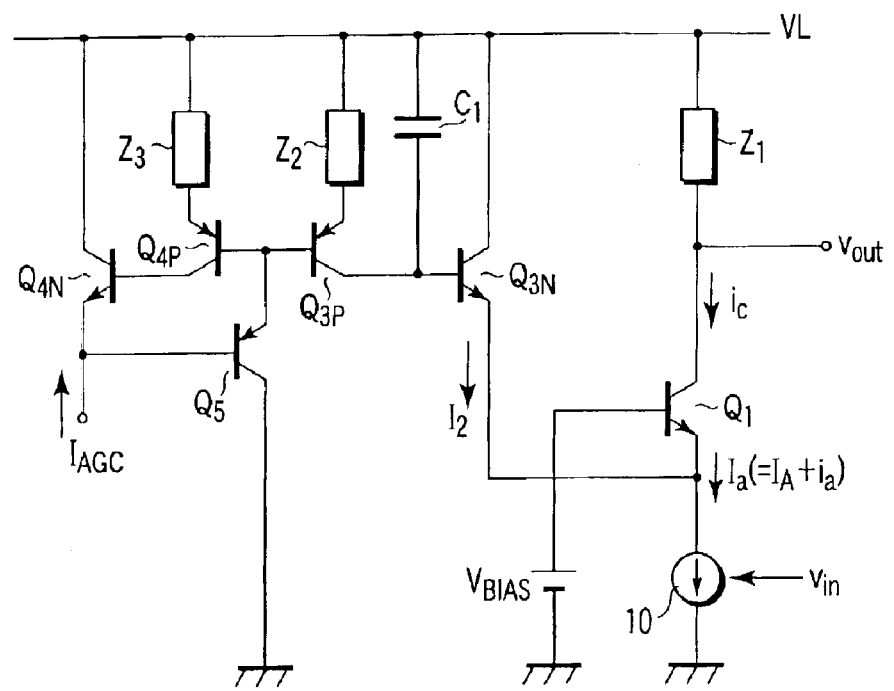
FIG. 10 is a circuit diagram depicting a base configuration of a variable gain amplifier in accordance with a tenth embodiment of the present invention.

FIG. 10 shows an example of a basic circuit configuration of a variable gain amplifier in accordance with a tenth embodiment of the present invention. Here, a description will be given by way of example of a single-phase variable gain amplifier of current control system which carries out gain control according to a gain control current.

That is, this variable gain amplifier is provided as a still additional example in which an element for distortion proof of the inverted darlington circuit is added in the variable gain amplifier shown in FIG. 8 described above. Like elements in FIG. 8 are designated by like reference numerals. A detailed description is omitted here.

In the variable gain amplifier according to the present embodiment, the power voltage from the power line VL is supplied to the collector terminal of the transistor $Q_{3N}$. In addition, the power voltage from the power line VL is supplied to the emitter terminal of the transistor $Q_{3P}$ via a load element $Z_2$. Similarly, the power voltage from the power line VL is supplied to the collector terminal of the transistor $Q_{4N}$. In addition, the power voltage from the power line VL is supplied to the emitter terminal of the transistor $Q_{4P}$ via a load element $Z_3$. In the case of the variable gain amplifier as well, as is the case with the variable gain amplifier shown in FIG. 8, the load elements $Z_2$, $Z_3$ function as elements for distortion proof of the inverted darlington circuit. Thus, more stable operation can be made as compared with the variable gain amplifier shown in FIG. 8.

(Eleventh Embodiment)

Figure 11:
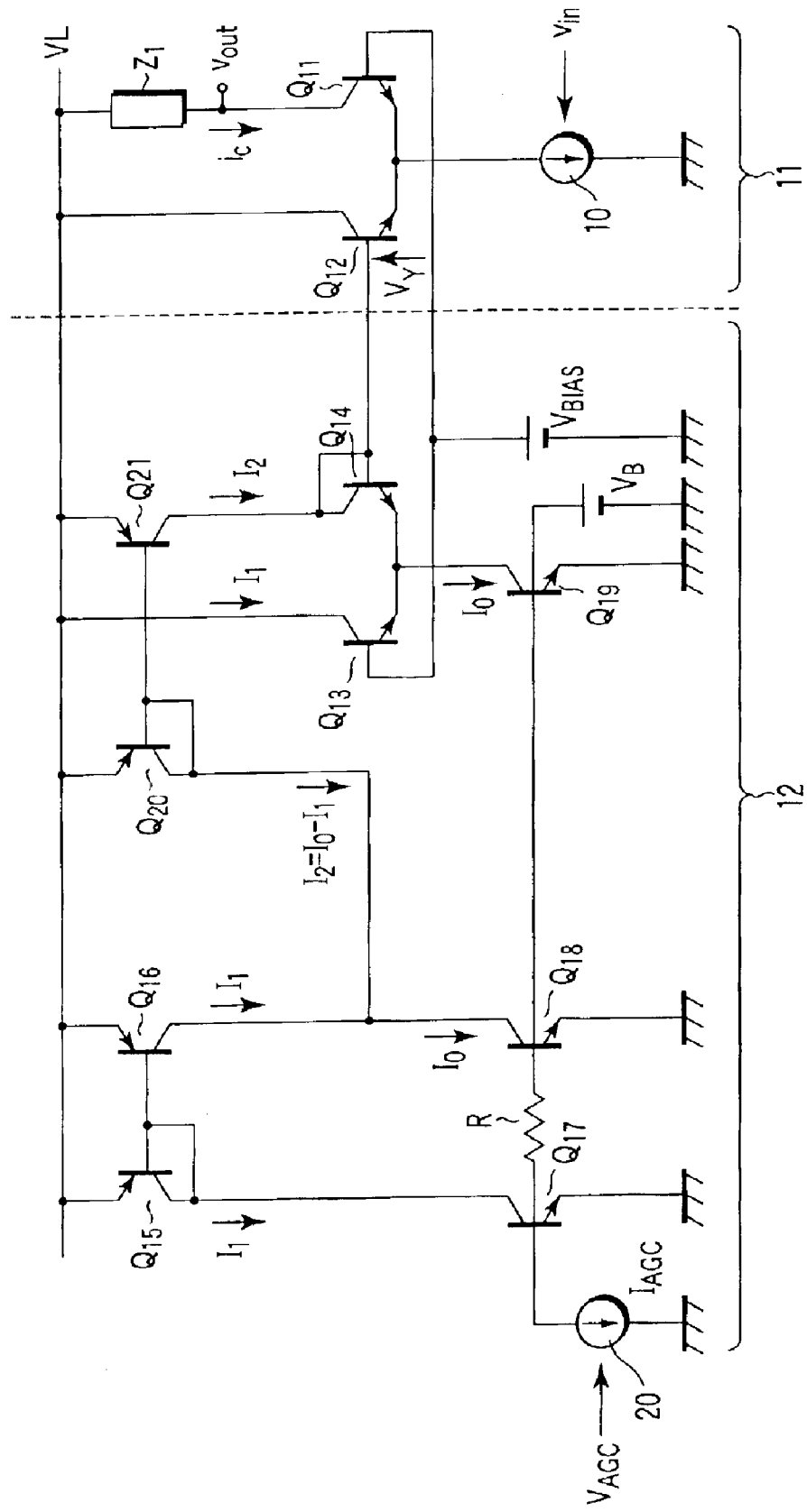
FIG. 11 is a circuit diagram depicting a base configuration of a variable gain amplifier in accordance with an eleventh embodiment of the present invention.

FIG. 11 shows an example of a basic circuit configuration of a variable gain amplifier in accordance with an eleventh embodiment of the present invention. A description will be given by way of example of a single-phase variable gain amplifier of voltage control system which carries out gain control according to a gain control voltage.

This variable gain amplifier comprises a gain control circuit 11 and a gain control signal converter circuit (gain control converter) 12. A gain control voltage $V_{AGC}$ is applied to the gain control signal converter circuit 12, whereby gain of the gain control circuit 11 is configured to be controlled.

That is, the gain control circuit 11 has one NPN transistor $Q_{11}$ and the other NPN transistor $Q_{12}$ which configure a differential transistor pair. A voltage/current converter 10 is connected to a common emitter terminal of both of the transistors $Q_{11}$, $Q_{12}$ so that an input signal voltage $v_{in}$ is supplied via the voltage/current converter 10. Then, an output signal voltage $v_{out}$ according to a current $i_c$, which corresponds to the scale of the input signal voltage $v_{in}$, is taken out from a collector terminal of the transistor $Q_{11}$ that is an output transistor.

The power voltage from a power line VL is supplied to a collector terminal of the transistor $Q_{11}$ via a load element $Z_1$. In addition, a base terminal of the transistor $Q_{11}$ is connected to a base terminal of an NPN transistor (one transistor) $Q_{13}$. A reference bias voltage $V_{BIAS}$ is supplied to a common base terminal of both of the transistors $Q_{11}$, $Q_{12}$. The power voltage from the power line VL is supplied to a collector terminal of the transistor $Q_{12}$. In addition, a base terminal of the transistor $Q_{12}$ is connected to a base terminal and a collector terminal of an NPN transistor (the other transistor) $Q_{14}$. Then, a gain control voltage $V_T$ is supplied between the base terminal of the transistor $Q_{11}$ and the base terminal of the transistor $Q_{12}$.

On the other hand, the gain control signal converter circuit 12 has a differential transistor pair comprising the transistors $Q_{13}$, $Q_{14}$. A common emitter terminal of both of the transistors $Q_{13}$, $Q_{14}$ is connected to a collector terminal of an NPN transistor $Q_{19}$. The power voltage from the power line VL is supplied to a collector terminal of the transistor $Q_{13}$. The base terminal and collector terminal of the transistor $Q_{14}$ are connected to a collector terminal of one PNP transistor $Q_{21}$ which configures a current mirror circuit.

The power voltage from the power line VL is supplied to an emitter terminal of the transistor $Q_{21}$. In addition, a base terminal of the transistor $Q_{21}$ is connected to a base terminal and a collector terminal of the other PNP transistor $Q_{20}$ which configures the current mirror circuit. The power voltage from the power line VL is supplied to an emitter terminal of the transistor $Q_{20}$. In addition, the base terminal and collector terminal of the transistor $Q_{20}$ are connected to a collector terminal of a PNP transistor $Q_{16}$ and a collector terminal of an NPN transistor $Q_{18}$.

The power voltage from the power line VL is supplied to an emitter terminal of the transistor $Q_{16}$. In addition, a base terminal of the transistor $Q_{16}$ is connected to a base terminal and a collector terminal of a PNP transistor $Q_{15}$. The power voltage from the power line VL is supplied to an emitter terminal of the transistor $Q_{15}$. In addition, the base terminal and collector terminal of the transistor $Q_{15}$ are connected to a collector terminal of the NPN transistor $Q_{17}$.

Base terminals of the transistors $Q_{18}$, $Q_{19}$ are connected in common, and a reference base voltage $V_B$ is supplied to a common base terminal of these transistors, respectively. (Emitter terminals of the transistors $Q_{18}$, $Q_{19}$ are connected to a ground potential). In addition, a resistor R is inserted between base terminals of the transistors $Q_{17}$, $Q_{18}$. Further, the gain control voltage $V_{AGC}$ is supplied to the base terminal of the transistor $Q_{17}$ via a voltage/current converter 20. (An emitter terminal of the transistor $Q_{17}$ is connected to a ground potential). In this manner, a gain control current $I_{AGC}$ proportional to the gain control voltage $V_{AGC}$ is imparted to the resistor R. Namely, a voltage proportional to the gain control voltage $V_{AGC}$ is imparted to the resistor R.

In the case of the variable gain amplifier according to the present embodiment, a reproducer circuit for reproducing a current ratio is composed of the transistors $Q_{11}$, $Q_{12}$, $Q_{13}$, $Q_{14}$. The reproducer circuit is provided to set a ratio of a current flowing the transistors $Q_{11}$, $Q_{12}$ according to currents $I_1$, $I_2$ flowing the transistors $Q_{13}$, $Q_{14}$.

In such a configuration, when the gain control voltage $V_{AGC}$ is supplied to the voltage/current converter 20, the currents $I_1$, $I_2$ flowing the transistors $Q_{13}$, $Q_{14}$ are generated by the gain control signal converter circuit 12. Then, by a function of the reproducer circuit, the currents flowing the transistors $Q_{11}$, $Q_{12}$ are set according to a ratio of the currents $I_1$, $I_2$. In this manner, the current (direct current component and alternating current component) generated by the voltage/current converter 10 based on the input signal voltage $v_{in}$ is distributed by the transistors $Q_{11}$, $Q_{12}$ based on the ratio of the currents $I_1$, $I_2$.

That is, a difference between a voltage $V_{BE13}$ between a base and an emitter generated at the transistor $Q_{13}$ according to the current $I_1$ and a voltage $V_{BE14}$ between a base and an emitter generated at the transistor $Q_{14}$ according to the current $I_2$ is supplied as the gain control voltage $V_Y$ between the base terminal of the transistor $Q_{11}$ and the base terminal of the transistor $Q_{12}$. As a result, an output signal voltage $v_{out}$ according to a current $i_c$, which corresponds to the scale of an input signal voltage $v_{in}$, is taken out from a collector terminal of the output transistor $Q_{11}$. At this time, a base voltage of the output transistor $Q_{11}$ is maintained to be constant according to a reference bias voltage $V_{BIAS}$. Therefore, even if a gain is large, it becomes possible to prevent a dynamic range from being reduced.

In the conventional variable gain amplifier, a gain has been controlled by adding a gain control current corresponding to the current $I_1$ of FIG. 11 as a collector current of the transistor $Q_{14}$. Thus, of the transistors $Q_{11}$, $Q_{12}$ configuring a differential transistor pair, a base voltage of the transistor $Q_{12}$ is avoidably provided as a reference potential. As a result, there has been a danger that the base voltage of the transistor $Q_{11}$ changes, thereby causing a change in dynamic range and impairing a distortion feature.

In contrast, in the variable gain amplifier according to the present embodiment, subtraction of a gain control current, i.e., computation of $I_2 = I_0 - I_1$ is carried out by using the transistors $Q_{16}$, $Q_{17}$, $Q_{20}$. Then, the current $I_2$ after this subtraction has been carried out is added as a collector current of the transistor $Q_{14}$, thereby making it possible to provide the base voltage of the transistor $Q_{11}$ as a reference potential. As a result, a change in dynamic range is prevented, making it possible to restrict a distortion feature from being impaired.

Here, in FIG. 11, a voltage between a base and an emitter of the transistor $Q_{19}$ is $V_{BE19}$; a voltage between a base and an emitter of the transistor $Q_{18}$ is $V_{BE18}$; and a voltage between a base and an emitter of the transistor $Q_{17}$ is $V_{BE17} - R \cdot I_{AGC}$. Assuming that the gain control current $I_{AGC}$ is proportional to the gain control voltage $V_{AGC}$ (K is a proportional constant), a voltage between a base and an emitter of the transistor $Q_{17}$ is $V_{BE17} - K \cdot V_{AGC}$.

Therefore, assuming that a transistor saturation current is $I_S$ and a thermal voltage is $V_T$, the following is obtained from the above formula (11).

$$I_0 = I_S \cdot \exp(V_{BE17}/V_T)$$

$$I_1 = I_S \cdot \exp\{(V_{BE17} - K \cdot V_{AGC})/V_T\}$$

$$= I_0 \cdot \exp\{(-K \cdot V_{AGC})/V_T\}$$

Thus, the following result is obtained.

$$I_2 = I_0 - I_1$$

$$= I_0\{1 - \exp(-K \cdot V_{AGC}/V_T)\}$$

On the other hand, a voltage $V_{BE14}$ between a base and an emitter of the transistor $Q_{14}$ is obtained below, assuming that a natural logarithm is "ln".

$$V_{BE14} = V_T \cdot \ln\{I_2/I_S\}$$

Similarly, a voltage $V_{BE13}$ between a base and an emitter of the transistor $Q_{13}$ is obtained below, $$V_{BE13} = V_T \cdot \ln\{I_1/I_S\}$$

The gain control voltage $V_Y$ is obtained below.

$$V_Y = V_{BE14} - V_{BE13}$$

$$= V_T \cdot \ln\{I_2/I_1\}$$

$$= V_T \cdot \ln\{\exp(K \cdot V_{AGC}/V_T) - 1\}$$

In contrast, assuming that a voltage gain is $G_V$, and a proportional constant is A, a gain control feature of a differential transistor pair comprising the transistors $Q_{11}$, $Q_{12}$ is obtained below.

$$G_V = A/\{1 + \exp(V_Y/V_T)\}$$

Here, by substituting the above formula of $V_Y$, the following is obtained, and it is found that an exponential function like gain control feature is obtained.

$$G_V = A \cdot \exp(-K \cdot V_{AGC}/V_T)$$

It is found that am exponential function like gain control feature can be obtained.

In this manner, in the variable gain amplifier according to the present embodiment, while an exponential function like gain control feature is maintained, the base voltage of the transistor 11 is maintained to be constant. In this manner, an output dynamic range can be maintained to be constant, thus making it possible to prevent a distortion feature from being impaired.

(Twelfth Embodiment)

Figure 12:
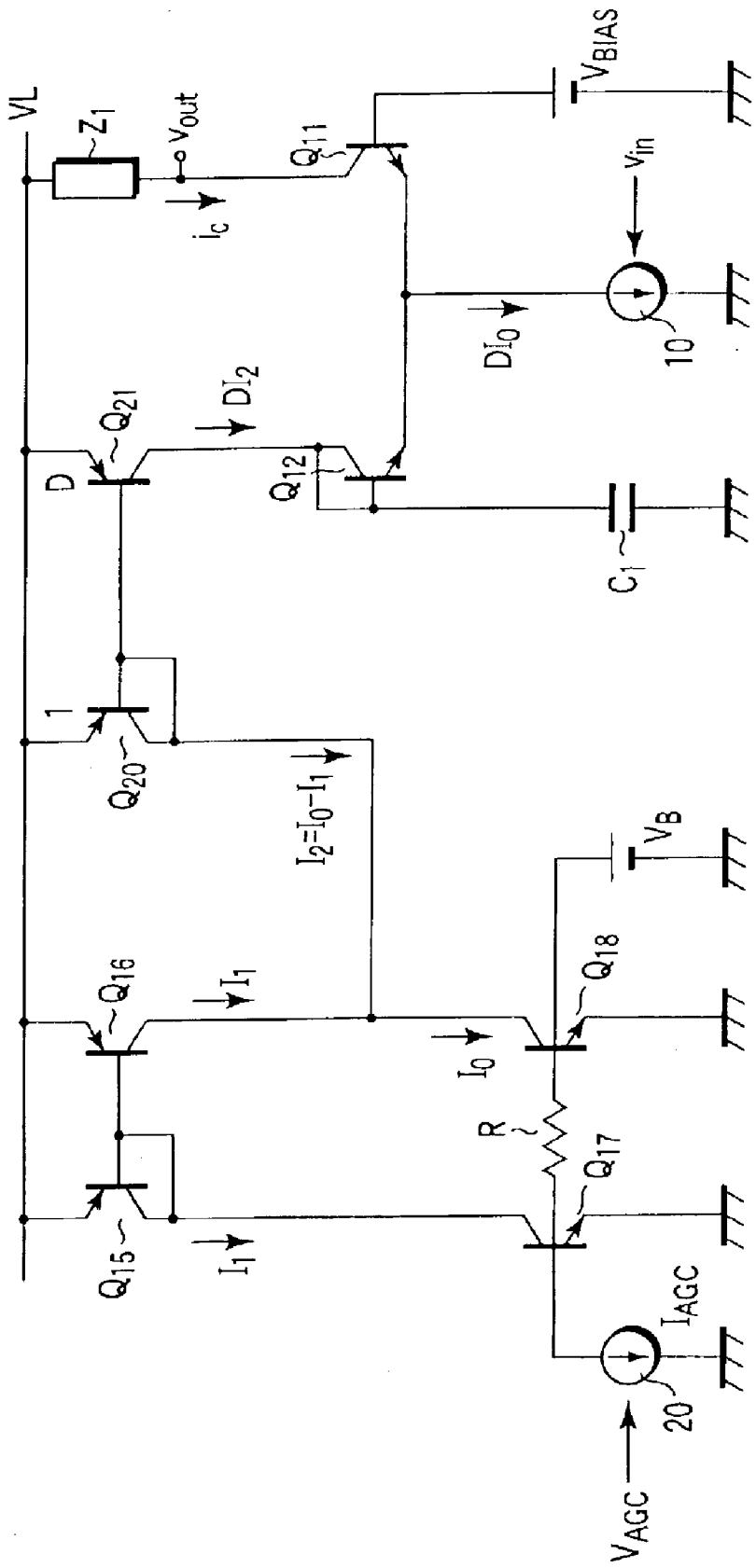
FIG. 12 is a circuit diagram depicting a base configuration of a variable gain amplifier in accordance with a twelfth embodiment of the present invention.

FIG. 12 shows an example of a basic circuit configuration of a variable gain amplifier in accordance with a twelfth embodiment of the present invention. Here, a description will be given by way of example of a single-phase variable gain amplifier of voltage control system which carries out gain control according to a gain control voltage.

That is, this variable gain amplifier is provided as an example in which a configuration has been provided without using the reproducer circuit comprising NPN transistors $Q_{11}$, $Q_{12}$, $Q_{13}$, $Q_{14}$ in the variable gain amplifier shown in FIG. 11 described above. Like elements in FIG. 11 are designated by like reference numerals. A detailed description is omitted here.

In the case of the variable gain amplifier according to the present embodiment, the collector terminal and base terminal of the transistor $Q_{12}$ are connected to a collector terminal of one PNP transistor $Q_{21}$ which configures a current mirror circuit. In addition, the collector terminal and base terminal of the transistor $Q_{12}$ are connected to a ground potential via a capacitor $C_1$.

The power voltage from the power line VL is supplied to an emitter terminal of the transistor $Q_{21}$. Also, a base terminal of the transistor $Q_{21}$ is connected to a base terminal and a collector terminal of the other PNP transistor $Q_{20}$ which configures the current mirror circuit. The power voltage from the power line is supplied to an emitter terminal of the transistor $Q_{20}$. In addition, the base terminal and collector terminal of the transistor $Q_{20}$ are collected to the collector terminal of the PNP transistor $Q_{16}$ and the collector terminal of the NPN transistor $Q_{18}$. A reference base voltage $V_B$ is supplied to the base terminal of the transistor $Q_{18}$. (The emitter terminal of the transistor $Q_{18}$ is connected to a ground potential).

In such a configuration, when a gain control voltage $V_{AGC}$ is supplied to the voltage/current converter 20, currents $I_1$, $I_2$ flowing the transistors $Q_{16}$, $Q_{20}$ are generated. Then, a ratio $(I_1:DI_2)$ of the currents flowing the transistors $Q_{11}$, $Q_{12}$ is set according to a mirror ratio of the current mirror circuit (for example, 1:D). In this manner, a current (direct current component and alternating current component) generated by the voltage/current converter 10 based on the input signal voltage $v_{in}$ is distributed by the transistors $Q_{11}$, $Q_{12}$ based on the ratio of the above current.

As a result, an output signal voltage $v_{out}$ according to a current $i_c$, which corresponds to the scale of the input signal voltage $v_{in}$, is taken out from a collector terminal of the output transistor $Q_{11}$. At this time, the base voltage of the output transistor $Q_{11}$ is maintained to be constant according to a reference bias voltage $V_{BIAS}$. Therefore, even if a gain is large, it becomes possible to prevent a dynamic range from being reduced.

Assuming that a mirror ratio of a current mirror circuit comprising the transistor $Q_{20}$, $Q_{21}$ is 1: D, and a natural logarithm is "ln", a voltage $V_{BE12}$ between a base and an emitter of the transistor $Q_{12}$ is obtained below.

$$V_{BE12} = V_T \cdot \ln(DI_2/I_S)$$

Similarly, a voltage $V_{BE11}$ between a base and an emitter of the transistor $Q_{11}$ is obtained below.

$$V_{BE11} = V_T \cdot \ln(DI_1/I_S)$$

where $DI_1$ is a collector current $(=DI_0-DI_2)$ of the transistor $Q_{11}$.

Assuming that a voltage (gain control voltage) between a base and an emitter of the transistors $Q_{12}$, $Q_{11}$ is $V_Y$, the following is obtained.

$$V_Y = V_{BE12} - V_{BE11}$$
$$= V_T \cdot \ln\{I_2/I_1\}$$
$$= V_T \cdot \ln\{\exp(K \cdot V_{AGC}/V_T) - 1\}$$

In addition, assuming that a voltage gain is $G_V$, and a potential constant is A, a gain control feature of a differential pair comprising the transistors $Q_{11}$, $Q_{12}$ is obtained as follows.

$$G_V = A/\{1+\exp(V_Y/V_T)\}$$

Here, by substituting the above formula of $V_Y$, the following is obtained.

$$G_V = A \cdot \exp(-K \cdot V_{AGC}/V_T)$$

It is found that am exponential function like gain control feature can be obtained.

In this manner, in the variable gain amplifier according to the present embodiment as well, an exponential function like gain control feature is achieved as is the case with the variable gain amplifier shown in the eleventh embodiment described above. Moreover, while the exponential function like gain control feature is maintained, the base voltage of the transistor $Q_{11}$ is maintained to be constant, whereby an output dynamic range can be maintained to be constant, thus making it possible to prevent a distortion feature from being impaired.

In particular, in the case of the variable gain amplifier according to the present embodiment, a current $DI_2$ corresponding to a gain control current is directly supplied as a collector current of the NPN transistor $Q_{12}$, thereby controlling a gain. Therefore, an advantageous effect similar to that of the variable gain amplifier shown in the eleventh embodiment can be attained without using the above described reproducer circuit. Moreover, although a capacitor $C_1$ is required, the number of parts for the amplifier can be reduced as a while.

(Thirteenth Embodiment)

Figure 13:
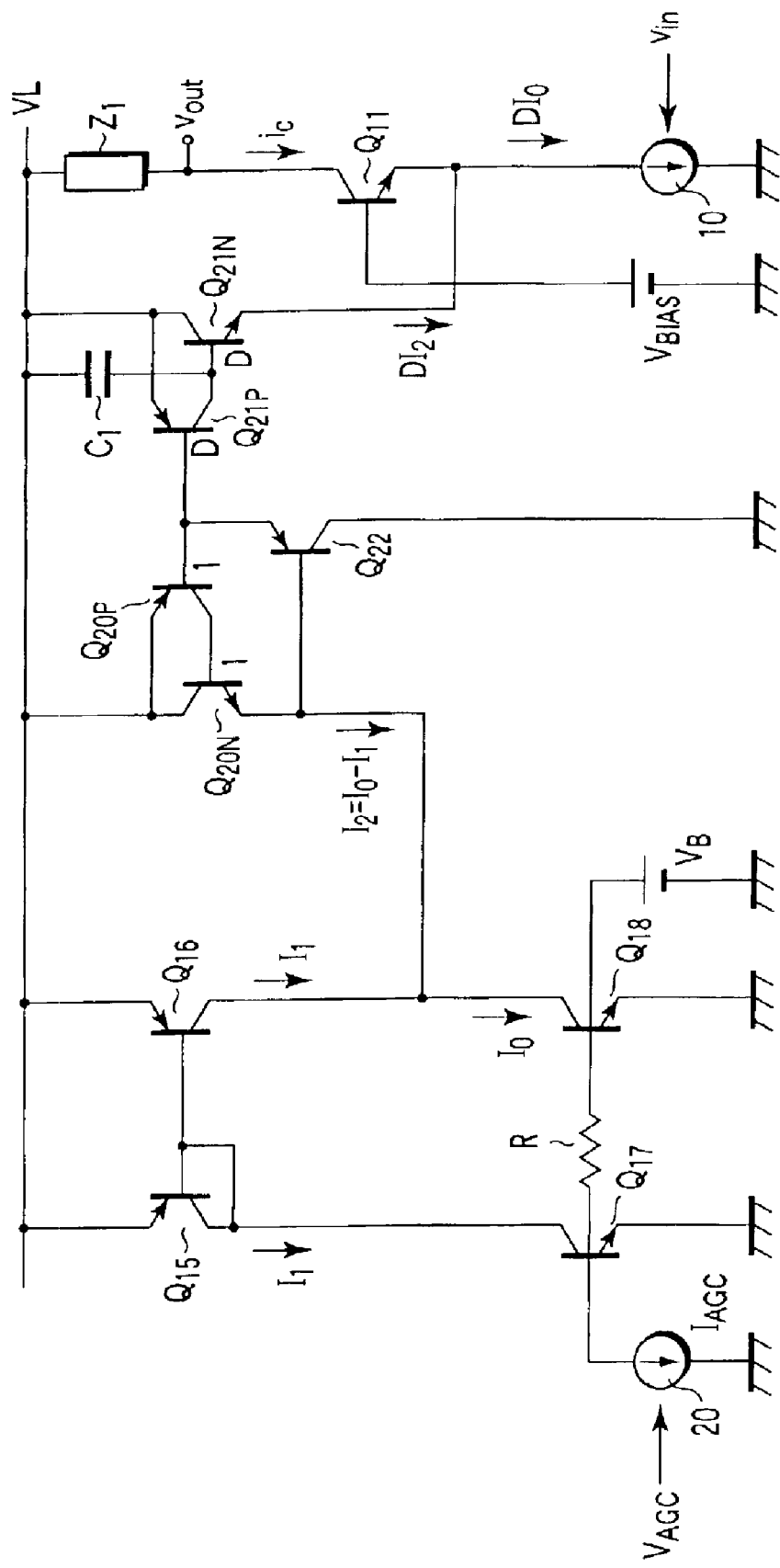
FIG. 13 is a circuit diagram depicting a base configuration of a variable gain amplifier in accordance with a thirteenth embodiment of the present invention.

FIG. 13 shows an example of a basic circuit configuration of a variable gain amplifier in accordance with a thirteenth embodiment of the present invention. Here, a description will be given by way of example of a single-phase variable gain amplifier of voltage control system which carries out gain control according to a gain control voltage.

That is, this variable gain amplifier is provided as an example in which a current mirror circuit using an inverted darlington circuit is provided in the variable gain amplifier shown in FIG. 12 described above. Like elements in FIG. 12 are designated by like reference numerals.

In the case of the variable gain amplifier according to the present embodiment, the current mirror circuit is configured to include a PNP transistor $Q_{20P}$ and an NPN transistor $Q_{20N}$ connected via an inverted darlington circuit and a PNP transistor $Q_{21P}$ and an NPN transistor $Q_{21N}$ connected via an inverted darlington circuit. In addition, a difference transistor pair is configured to have the transistor $Q_{21N}$ and the NPN transistor (output transistor) $Q_{11}$.

A base terminal of the transistor $Q_{21N}$ is connected to a collector terminal of the transistor $Q_{21P}$. Then, a power voltage from a power line VL is supplied to a base terminal of the transistor $Q_{21N}$ and a collector terminal of the transistor $Q_{21P}$ via a capacitor $C_1$. In addition, a collector terminal of the transistor $Q_{21N}$ is connected to an emitter terminal of the transistor $Q_{21P}$. Then, the power voltage from the power line VL is supplied to a collector terminal of the transistor $Q_{21N}$ and an emitter terminal of the transistor $Q_{21P}$. A base terminal of the transistor $Q_{21P}$ is connected to a base terminal of the transistor $Q_{20P}$ and an emitter terminal of a PNP transistor $Q_{22}$ which serves as an element for constant voltage generation.

An emitter terminal of the transistor $Q_{20P}$ is connected to a collector terminal of the transistor $Q_{20N}$. Then, the power voltage from the power line VL is supplied to the emitter terminal of the transistor $Q_{20P}$ and the collector terminal of the transistor $Q_{20N}$. In addition, a collector terminal of the transistor $Q_{20P}$ is connected to a base terminal of the transistor $Q_{20N}$. An emitter terminal of the transistor $Q_{20N}$ is connected to a base terminal of the transistor $Q_{22}$, a collector terminal of a PNP transistor $Q_{16}$, and a collector terminal of an NPN transistor $Q_{18}$. A collector terminal of the transistor $Q_{22}$ is connected to a ground potential.

In the case of the variable gain amplifier according to the present embodiment, a high frequency variable gain amplifier is provided by connecting a capacitor $C_1$ to the base terminal of the transistor $Q_{21N}$.

Here, in FIG. 13, assuming a mirror ratio of a current mirror circuit comprising the transistors $Q_{20N}$, $Q_{20P}$, $Q_{21N}$, $Q_{21P}$ is 1: D, and a natural logarithm is "ln", a voltage $V_{BE21N}$ between a base and an emitter of the transistor $Q_{21N}$ is obtained as follows.

$$V_{BE21N} = V_T \cdot \ln\{DI_2/I_S\}$$

Similarly, a voltage $V_{BE11}$ between a base and an emitter of the transistor $Q_{11}$ is obtained below.

$$V_{BE11} = V_T \cdot \ln(DI_1/I_S)$$

where $DI_1$ is a collector current $(=DI_0-DI_2)$ of the transistor $Q_{11}$.

Therefore, assuming that a voltage (gain control voltage) between a base and an emitter of the transistors $Q_{21N}$, $Q_{11}$ is $V_Y$, the following is obtained.

$$\begin{aligned} V_Y &= V_{BE21N} - V_{BE11} \\ &= V_Y \cdot \ln\{I_2/I_1\} \\ &= V_Y \cdot \ln\{\exp(K \cdot V_{AGC}/V_T) - 1\} \end{aligned}$$

In addition, assuming that a voltage gain is $G_V$, and a proportional constant is A, a gain control feature of a differential transistor pair comprising the transistors $Q_{11}$, $Q_{21N}$ is obtained as follows.

$$G_V = A/\{1 + \exp(V_Y/V_T)\}$$

Here, by substituting the above formula of $V_Y$, the following is obtained.

$$G_V = A \cdot \exp(-K \cdot V_{AGC}/V_T)$$

Therefore, it is found that an exponential function like gain control feature is obtained.

In this manner, in the variable gain amplifier according to the present embodiment, there is provided an exponential function like gain control feature as is the case with the variable gain amplifier shown in the twelfth embodiment described above. Moreover, while the exponential function like gain control feature is maintained, the base voltage of the transistor $Q_{11}$ is maintained to be constant, whereby an output dynamic range can be maintained to be constant, thus making it possible to prevent a distortion feature from being impaired.

In addition, in the case of the present embodiment, assuming that an emitter grounding current amplification rate of the transistor $Q_{21N}$ is $\beta_{21N}$, a base current of the transistor $Q_{21N}$ is obtained $DI_2/\beta_{21N}$, and a collector current of the transistor $Q_{21P}$ is obtained as $DI_2/\beta_{21N}$. Therefore, as described in the previous embodiment, in use of mass current and mass output, the amplifier shown in FIG. 13 is more preferred than that shown in FIG. 12. Namely, in the case of the amplifier shown in FIG. 13, almost of the current flows the NPN transistor $Q_{21N}$. Thus, in the case where a variable gain amplifier with mass current and mass output is provided, a chip area can be reduced by using an NPN transistor $Q_{21N}$ whose area is small.

In this manner, in the variable gain amplifier according to the present embodiment, an exponential function like gain control feature is achieved as is the case with the variable gain amplifier shown in the twelfth embodiment described above. Moreover, while an exponential function like gain control feature is maintained, the base voltage of the transistor $Q_{11}$ is maintained to be constant, whereby an output dynamic range is maintained to be constant, thus making it possible to prevent a distortion feature from being impaired.

In particular, in the case of the variable gain amplifier according to the present embodiment, a current $DI_2$ corresponding to a gain control current is directly supplied as an emitter current of the NPN transistor $Q_{21N}$, thereby controlling a gain. Therefore, an advantageous effect similar to that of the variable gain amplifier shown in the eleventh embodiment can be attained without using the above described reproducer circuit. Moreover, although the capacitor $C_1$ is required, the number of parts for the amplifier can be reduced as a whole.

In addition, the NPN transistor $Q_{21N}$ whose area is small can be used, thus making it possible to reduce a chip area even in the case where the transistor is employed for use of mass current and mass output.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable gain amplifier capable of a gain according to a gain control signal, comprising:
   a differential transistor pair including one transistor and an other transistor, an output signal voltage being taken out from a collector terminal of said one transistor, and a first gain control signal to a gain directly supplied to the base terminal and collector terminal of said other transistor;
   a first voltage/current converter connected to a common emitter terminal of said one transistor and said other transistor, the converter having an input signal voltage supplied thereto;

a power circuit which applies a constant bias voltage to a base terminal of said one transistor; and a capacitor connected to at least a base terminal of said other transistor.

2. A variable gain amplifier according to claim 1, wherein a power voltage from a power line is supplied via a load element to the collector terminal of said one transistor.

3. A variable gain amplifier capable of controlling a gain according to a gain control signal, comprising:

a differential transistor pair including one transistor and an other transistor, an output signal voltage being taken out from a collector terminal of said one transistor, and a first gain control signal to control a gain being supplied via an input circuit to the base terminal and collector terminal of said other transistor;

a first voltage/current converter connected to a common emitter terminal of said one transistor and said other transistor, the converter having an input signal voltage supplied thereto:

a power circuit which applies a constant bias voltage to a base terminal of said one transistor; and a capacitor connected to at least a base terminal of said other transistor.

4. A variable gain amplifier according to claim 3, wherein the input circuit is a current mirror circuit including a PNP transistor for current amplification and a PNP transistor for current/voltage conversion.

5. A variable gain amplifier according to claim 3, wherein a power voltage from a power line is supplied via a load element to the collector terminal of said one transistor.

6. A variable gain amplifier capable of controlling a gain according to a gain control signal, comprising:

a differential transistor pair including one transistor and an other transistor, an output signal voltage being taken out from a collector terminal of said one transistor, and a first gain control signal to control a gain being supplied to an input circuit including said other transistor, the input circuit including a current mirror circuit comprising an inverted darlington circuit including an NPN transistor for current amplification, a PNP transistor for voltage/current conversion, a PNP transistor for voltage amplification, and an NPN transistor for current/voltage conversion;

a first voltage/current converter connected to a common emitter terminal of said one transistor and said other transistor, the converter having an input signal voltage supplied thereto;

a power circuit which applies a constant bias voltage to a base terminal of said one transistor; and a capacitor connected to at least a base terminal of said other transistor.

7. A variable gain amplifier according to claim 6, wherein a power voltage from a power line is supplied via a load element to a collector terminal of the NPN transistor for current amplification and the PNP transistor for voltage/current conversion; and the power voltage from the power line is supplied via a load element to a collector of the NPN transistor for current/voltage conversion and an emitter terminal of the PNP transistor for voltage amplification.

8. A variable gain amplifier capable of controlling a gain according to a gain control signal, comprising:

a differential transistor pair including one transistor and an other transistor, an output signal voltage being taken out from a collector terminal of said one transistor, and a first gain control signal to control a gain being supplied to an input circuit including said other transistor, the input circuit including a current mirror circuit comprising an inverted darlington circuit including an NPN transistor for current amplification, a PNP transistor for voltage/current conversion, a PNP transistor for voltage amplification, and an NP transistor for current/voltage conversion;

a first voltage/current converter connected to a common emitter terminal of said one transistor and said other transistor, the converter having an input signal voltage supplied thereto;

a power circuit which applies a constant bias voltage to a base terminal of said one transistor; and a capacitor connected to at least a base terminal of said other transistor, wherein a power voltage from a power line is supplied via a load element to an emitter terminal of the PNP transistor for voltage/current conversion; and the power voltage from the power line is supplied via a load element to an emitter terminal of the PNP transistor for voltage amplification.

9. A variable gain amplifier capable of controlling a gain according to a gain control signal, comprising:

a differential transistor pair including one transistor and an other transistor, an output signal voltage being taken out from a collector terminal of said one transistor, and a first gain control signal to control a gain being supplied to an input circuit including said other transistor and a PNP transistor for constant voltage generation;

a first voltage/current converter connected to a common emitter terminal of said one transistor and said other transistor, the converter having an input signal voltage supplied thereto;

a power circuit which applies a constant bias voltage to a base terminal of said one transistor; and a capacitor connected to at least a base terminal of said other transistor.

10. A variable gain amplifier capable of controlling a gain according to a gain control signal, comprising:

a differential transistor pair including one transistor and an other transistor, an output signal voltage being taken out from a collector terminal of said one transistor;

a first voltage/current converter connected to a common emitter terminal of said one transistor and said other transistor, the first voltage/current converter having an input signal voltage supplied thereto;

a power circuit which applies a constant bias voltage to a base terminal of said one transistor;

a capacitor connected to at least a base terminal of said other transistor; and an input circuit connected to said other transistor, the input circuit being supplied with a second gain control signal to control a gain, wherein the input circuit is a second voltage/current converter which generates a first gain control signal based on the second gain control signal.

11. A variable gain amplifier according to claim 10, wherein a power voltage from a power line is supplied via a load element to the collector terminal of said one transistor.

12. A variable gain amplifier capable of controlling a gain according to a gain control signal, comprising:

a differential transistor pair including one transistor and an other transistor, an output signal voltage being taken out from a collector terminal of said one transistor;

a first voltage/current converter connected to a common emitter terminal of said one transistor and said other transistor, the first voltage/current converter having an input signal voltage supplied thereto;

a power circuit which applies a constant bias voltage to a base terminal of said one transistor;

a capacitor connected to at least a base terminal of said other transistor; and an input circuit connected to said other transistor, the input circuit being supplied with a second gain control signal to control a gain, wherein the input circuit is a PNP transistor for voltage/current conversion which generates a first gain control signal based on the second gain control signal.

13. A variable gain amplifier according to claim 12, wherein a power voltage from a power line is supplied via a load element to the collector terminal of said one transistor.

14. A variable gain amplifier capable of controlling a gain according to a gain control signal, comprising:

a differential transistor pair including one transistor and an other transistor, an output signal voltage being taken out from a collector terminal of said one transistor;

a first voltage/current converter connected to a common emitter terminal of said one transistor and said other transistor, the first voltage/current converter having an input signal voltage supplied thereto;

a power circuit which applies a constant bias voltage to a base terminal of said one transistor;

a capacitor connected to at least a base terminal of said other transistor; and an input circuit connected to said other transistor, the input circuit being supplied with a second gain control signal to control a gain, wherein the input circuit is an inverted darlington circuit including an NPN transistor for current amplification and a PNP transistor for voltage/current conversion which generate a first gain control signal based on the second gain control signal.

15. A variable gain amplifier according to claim 14, wherein a power voltage from a power line is supplied via a load element to a collector terminal of the NPN transistor for current amplification and an emitter terminal of the PNP transistor for voltage/current conversion.

16. A variable gain amplifier according to claim 14, wherein a power voltage from a power line is supplied via a load element to an emitter terminal of the PNP transistor for voltage/current conversion.

17. A variable gain amplifier according to claim 14, wherein a power voltage from a power line is supplied via a load element to the collector terminal of said one transistor.

18. A variable gain amplifier capable of controlling a gain according to a gain control signal, comprising:

a differential transistor pair including one transistor and an other transistor, an output signal voltage being taken out from a collector terminal of said one transistor;

a first voltage/current converter connected to a common emitter terminal of said one transistor and said other transistor, the first voltage/current converter having an input signal voltage supplied thereto;

a power circuit which applies a constant bias voltage to a base terminal of said one transistor;

a capacitor connected to at least a base terminal of said other transistor; and an input circuit connected to said other transistor, the input circuit being supplied with a second gain control signal to control a gain, wherein the input circuit includes a current mirror circuit including a PNP transistor for current amplification and a PNP transistor for current/voltage conversion; and a second voltage/current converter.

19. A variable gain amplifier according to claim 18, wherein a power voltage from a power line is supplied via a load element to the collector terminal of said one transistor.

20. A variable gain amplifier capable of controlling a gain according to a gain control signal, comprising:

a differential transistor gain including one transistor and an other transistor, an output signal voltage being taken out from a collector terminal of said one transistor;

a first voltage/current converter connected to a common emitter terminal of said one transistor and said other transistor, the first voltage/current converter having an input signal voltage supplied thereto;

a power circuit which applies a constant bias voltage to a base terminal of said one transistor;

a capacitor connected to at least a base terminal of said other transistor; and an input circuit connected to said other transistor, the input circuit being supplied with a second gain control signal to control a gain, wherein the input circuit includes: a current mirror circuit comprising an inverted darlington circuit including an NPN transistor for current amplification, a PNP transistor for voltage/current conversion, a PNP transistor for voltage amplification, and an NPN transistor for current/voltage conversion; and a second voltage/current converter.

21. A variable gain amplifier according to claim 20, wherein the input circuit further includes a PNP transistor for constant voltage generation.

22. A variable gain amplifier according to claim 20, wherein a power voltage from a power line is supplied via a load element to the collector terminal of said one transistor.

* * * * *